(12) United States Patent
Akiyama et al.

(10) Patent No.: US 10,607,978 B2
(45) Date of Patent: *Mar. 31, 2020

(54) SEMICONDUCTOR DEVICE AND ELECTRONIC APPARATUS

(71) Applicant: Renesas Electronics Corporation, Tokyo (JP)

(72) Inventors: Satoru Akiyama, Tokyo (JP); Hiroyoshi Kobayashi, Tokyo (JP); Hisao Inomata, Tokyo (JP); Sei Saitou, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 109 days.

This patent is subject to a terminal disclaimer.

(21) Appl. No.: 15/894,564

(22) Filed: Feb. 12, 2018

(65) Prior Publication Data

US 2018/0166430 A1 Jun. 14, 2018

Related U.S. Application Data

(63) Continuation of application No. 14/733,776, filed on Jun. 8, 2015, now Pat. No. 9,960,153.

(30) Foreign Application Priority Data

Jun. 2, 2014 (JP) .................................. 2014-114063

(51) Int. Cl.
*H01L 25/18* (2006.01)
*H01L 23/495* (2006.01)
(Continued)

(52) U.S. Cl.
CPC .......... *H01L 25/18* (2013.01); *H01L 21/8213* (2013.01); *H01L 23/4952* (2013.01);
(Continued)

(58) Field of Classification Search
None
See application file for complete search history.

(56) References Cited

U.S. PATENT DOCUMENTS 6,535,050 B2 3/2003 Baudelot et al.
7,230,273 B2 6/2007 Kitabatake et al.
(Continued)

FOREIGN PATENT DOCUMENTS

CN 203260577 U 10/2013
CN 103516338 A 1/2014
(Continued)

OTHER PUBLICATIONS

Chinese Office Action dated Feb. 26, 2019, in corresponding Chinese Patent Application No. 2015102936294, with an English translation thereof.
(Continued)

*Primary Examiner* — Benjamin P Sandvik
(74) *Attorney, Agent, or Firm* — McDermott Will & Emery LLP

(57) ABSTRACT

A semiconductor device, including a first semiconductor chip including a first substrate having a semiconductor larger in bandgap than silicon, the first semiconductor chip being formed with a first FET including a first gate electrode, a first source, and a first drain, a second semiconductor chip including a second substrate having a semiconductor larger in bandgap than silicon, the second semiconductor chip being formed with a second FET having a second gate electrode, a second source, and a second drain, and a third semiconductor chip including a third substrate having silicon, the third semiconductor chip being formed with a MOSFET including a third gate electrode, a third source, and a third drain. The first semiconductor chip and the second semiconductor chip are mounted over a first chip
(Continued)

mounting section, and the third semiconductor chip is mounted over a second chip mounting section.

20 Claims, 16 Drawing Sheets

(51) Int. Cl.
H01L 21/82 (2006.01)
H03F 1/22 (2006.01)
H01L 23/498 (2006.01)
H01L 29/16 (2006.01)
H01L 29/20 (2006.01)
H01L 29/78 (2006.01)
H01L 29/808 (2006.01)
H01L 23/31 (2006.01)

(52) U.S. Cl.
CPC .. *H01L 23/49562* (2013.01); *H01L 23/49575* (2013.01); *H01L 23/49844* (2013.01); *H01L 29/1608* (2013.01); *H01L 29/2003* (2013.01); *H01L 29/78* (2013.01); *H01L 29/808* (2013.01); *H03F 1/223* (2013.01); *H03F 1/226* (2013.01); *H01L 23/3107* (2013.01); *H01L 2224/0603* (2013.01); *H01L 2224/48091* (2013.01); *H01L 2224/48137* (2013.01); *H01L 2224/48247* (2013.01); *H01L 2224/48472* (2013.01); *H01L 2224/49113* (2013.01); *H01L 2924/13091* (2013.01); *H01L 2924/181* (2013.01)

(56) References Cited

U.S. PATENT DOCUMENTS

| | | | |
|---|---|---|---|
| 8,624,303 B2 | 1/2014 | Fujikawa | |
| 9,048,119 B2 | 6/2015 | Kanazawa et al. | |
| 9,263,435 B2 | 2/2016 | Kanazawa et al. | |
| 9,960,153 B2 * | 5/2018 | Akiyama | H01L 21/8213 |
| 2001/0050589 A1 | 12/2001 | Baudelot et al. | |
| 2006/0043545 A1 | 3/2006 | Yea | |
| 2011/0102054 A1 | 5/2011 | Domes | |
| 2012/0280728 A1 | 11/2012 | Hussein | |
| 2013/0335134 A1 | 12/2013 | Kanazawa et al. | |
| 2014/0001481 A1 | 1/2014 | Michikoshi | |
| 2014/0209852 A1 | 7/2014 | Schulze | |
| 2014/0231829 A1 | 8/2014 | Kanazawa et al. | |

FOREIGN PATENT DOCUMENTS

| | | |
|---|---|---|
| JP | 2010-251772 A | 11/2010 |
| JP | 2011-210834 A | 10/2011 |
| JP | 2014-003110 A | 1/2014 |
| WO | WO 2013/046439 A1 | 4/2013 |

OTHER PUBLICATIONS

Japanese Office Action dated Feb. 27, 2018 in Japanese Application No. 2014-114063 with an English translation thereof.
Chinese Office Action dated Jul. 30, 2018, in corresponding Chinese Patent Application No. 2015102936294, with an English translation thereof.
Communication Pursuant to Article 94(3) EPC dated Mar. 1, 2018, in corresponding European Patent Application No. 15167738.2.
Japanese Office Action dated Mar. 26, 2019, in corresponding Japanese Patent Application No. 2018-135684, with an English translation thereof.
Taiwanese Office Action dated Jul. 10, 2018, in Taiwanese Patent Application No. 10720624050, with and English translation thereof.
U.S. Non-Final Rejection dated Aug. 10, 2016 in U.S. Appl. No. 14/733,776.
U.S. Non-Final Rejection dated Mar. 2, 2017 in U.S. Appl. No. 14/733,776.
U.S. Notice of Allowance dated Oct. 31, 2017 in U.S. Appl. No. 14/733,776.
Extended European Search Report dated Nov. 17, 2015.
Japanese Office Action dated Aug. 8, 2017 in Japanese Application No. 2014-114063 with an English translation thereof.
Extended European Search Report dated May 23, 2017.
Chinese Office Action dated Jul. 24, 2019, in corresponding Chinese Patent Application No. 201510293629.4, with an English translation thereof.

* cited by examiner

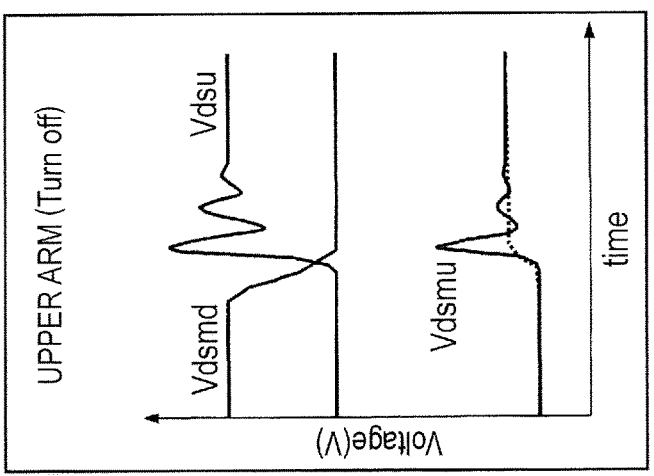
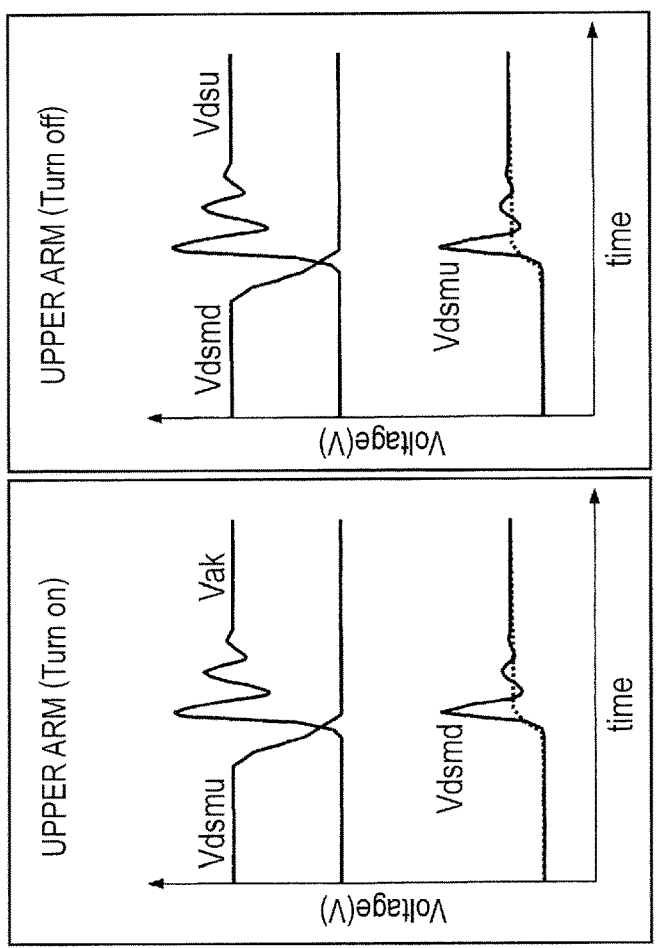
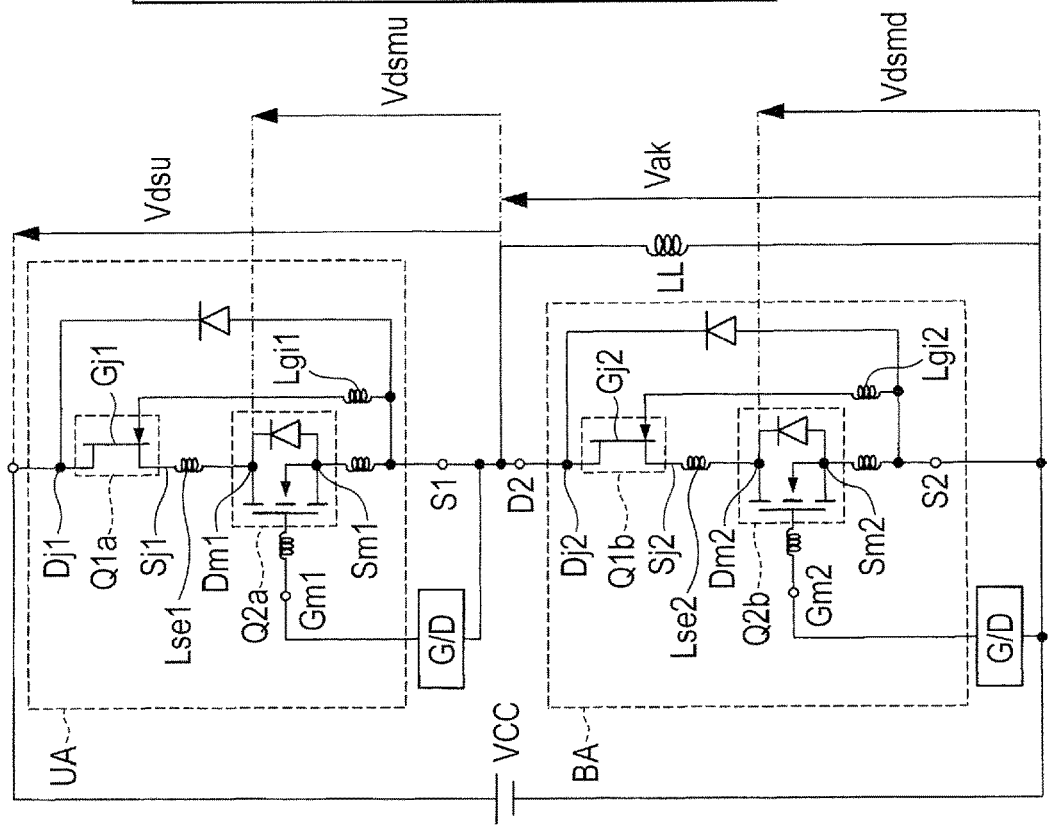

SEMICONDUCTOR DEVICE AND ELECTRONIC APPARATUS

CROSS-REFERENCE TO RELATED APPLICATIONS

The present application is a Continuation Application of U.S. patent application Ser. No. 14/733,776, filed on Jun. 8, 2015, which is based on Japanese Patent Application No. 2014-114063 filed on Jun. 2, 2014 including the specification, drawings and abstract is incorporated herein by reference in its entirety.

BACKGROUND

The present invention relates to a semiconductor device and an electronic apparatus, and to a technology effective when applied to a power semiconductor device used in, for example, an inverter for an air conditioner, a DC/DC converter for a computer power supply, an AC/AC inverter, inverter modules for a hybrid vehicle and an electric vehicle, etc., and an electronic apparatus including the power semiconductor device.

There has been described in International Patent Publication No. 2013/046439 (Patent Document 1), a mounting technique for a semiconductor device in which one junction FET (Junction Field Effect Transistor) with silicon carbide (SiC) as a material, and one MOSFET (Metal Oxide Semiconductor Field Effect Transistor) with silicon (Si) as a material are cascode-coupled.

A circuit diagram for cascode-coupling a plurality of junction FETs and one MOSFET has been described in U.S. Pat. No. 6,535,050 Specification (Patent Document 2).

RELATED ART DOCUMENTS

Patent Documents

[Patent Document 1] International Patent Publication No. 2013/046439
[Patent Document 2] U.S. Pat. No. 6,535,050 specification

SUMMARY

As a switching element (power semiconductor device) which makes an improvement in breakdown voltage and a reduction in on resistance compatible, there is known a switching element using a cascode coupling system. The switching element using the cascode coupling system has a configuration in which, for example, a normally-on junction FET using a material larger in bandgap than silicon, and a normally-off MOSFET using silicon are coupled in series. According to the switching element of the cascode coupling system, there can be obtained a switching element which is capable of ensuring a breakdown voltage by a junction FET large in insulation breakdown voltage and makes an improvement in breakdown voltage and a reduction in on resistance compatible by a reduction in on resistance by a normally-on junction FET and a reduction in on resistance by a low breakdown voltage MOSFET.

Here, for example, an inverter module (electronic apparatus) for a hybrid vehicle is required to have a large current capacity. For this reason, when a power semiconductor device using a cascode coupling system is adopted as a power semiconductor device that configures an inverter module, there is a need to increase the size of a semiconductor chip in order to increase the current capacity. That is, the power semiconductor device using the cascode coupling system has a junction FET semiconductor chip formed with a junction FET with silicon carbide as a material, and a MOSFET semiconductor chip formed with a MOSFET with silicon as a material. Thus, in order to increase the current capacity, there is a need to increase the size of the junction FET semiconductor chip and increase the size of the MOSFET semiconductor chip.

According to the examinations of the present inventors, however, the junction FET semiconductor chip uses, for example, silicon carbide as the material and is larger in crystal defects than the MOSFET semiconductor chip with silicon as the material. Therefore, it has been found that particularly when the size (active size) of the junction FET semiconductor chip is designed large to increase the current capacity, a proper product yield for the junction FET semiconductor chip is degraded. That is, according to the examinations of the present inventors, there exists in the semiconductor device using the cascode coupling system, room for its improvement when increasing the current capacity in terms of improving the manufacturing yield of the semiconductor device.

Other problems and novel features will be apparent from the description of the present specification and the accompanying drawings.

A semiconductor device of a cascode coupling system according to one aspect of the present invention has a plurality of junction FET semiconductor chips formed with a plurality of junction FETs in a divided fashion, and a MOSFET semiconductor chip formed with a MOSFET.

Further, an electronic apparatus according to one aspect of the present invention includes a semiconductor device of a cascode coupling system as a semiconductor device which is electrically coupled to a load and drives the load. The semiconductor device of the cascode coupling system has a plurality of junction FET semiconductor chips formed with a plurality of junction FETs in a divided fashion, and a MOSFET semiconductor chip formed with a MOSFET.

According to the above one aspect, it is possible to improve the manufacturing yield of a semiconductor device.

BRIEF DESCRIPTION OF THE DRAWINGS

FIG. 3A is a circuit diagram showing an inverter using cascode-coupled junction FETs and MOSFETs both shown in FIG. 2 as switching elements, FIG. 3B is a diagram showing waveforms when the switching element configuring an upper arm is turned on, and FIG. 3C is a diagram showing waveforms when the switching element configuring the upper arm is turned off;

DETAILED DESCRIPTION

Figure 1:
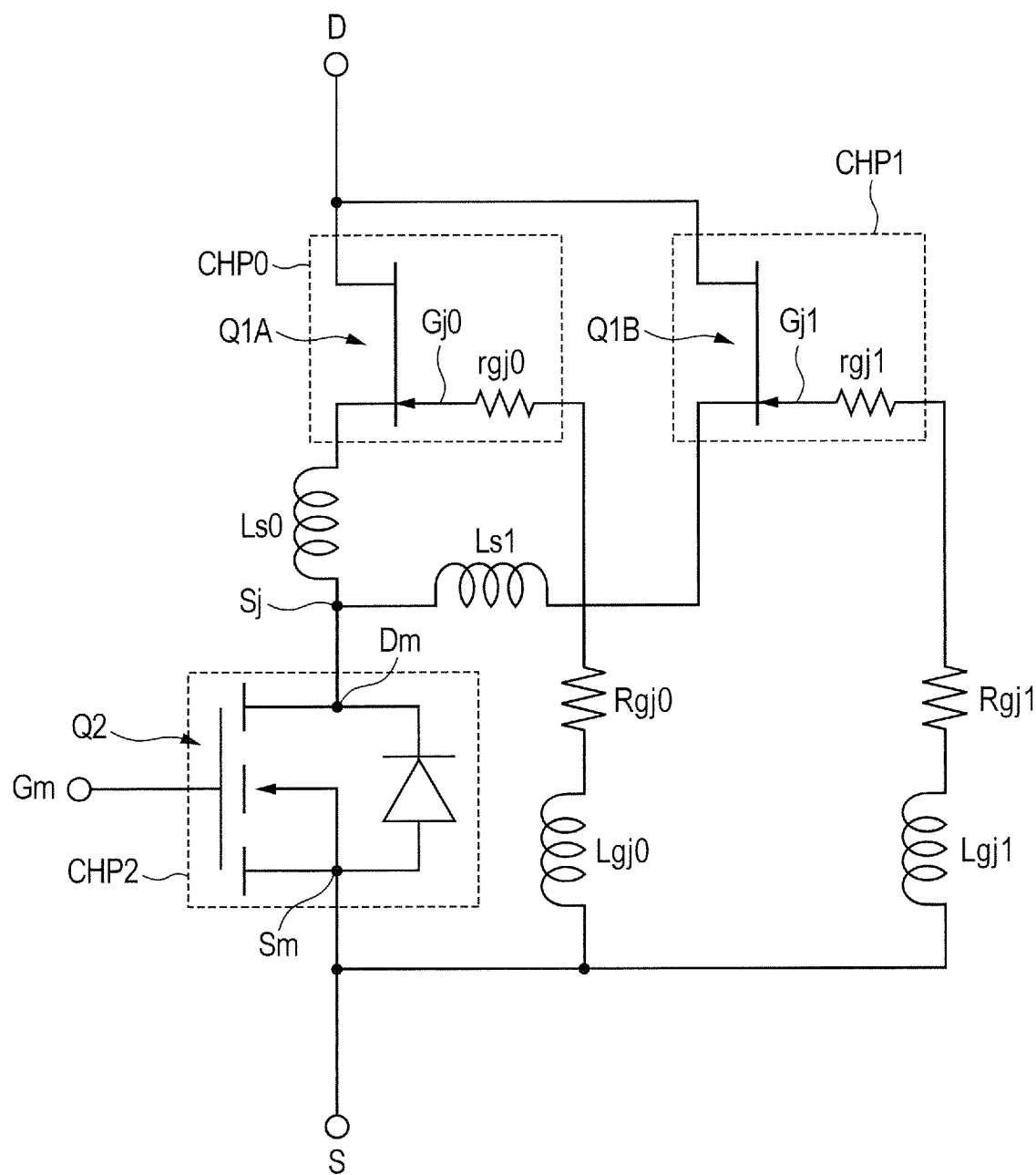
FIG. 1 is a diagram showing a circuit configuration of a power semiconductor device adopting a cascode coupling system according to an embodiment 1.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle.

Similarly, in the following embodiments, when reference is made to the shapes, positional relations and the like of the components or the like, they will include ones substantially analogous or similar to their shapes or the like except for where otherwise specified in particular and considered not to be definitely so in principle, etc. This is similarly applied even to the above-described numerical values and range.

The same reference numerals are respectively attached to the same members in principle in all the drawings for describing the embodiments, and a repeated description thereof will be omitted. Incidentally, even plan diagrams may be hatched for clarity of illustration.

Embodiment 1

<Utility of Cascode Coupling System>

In the large society trend in the preservation of a global environment, the electronics industry to reduce environmental loads is more increasing in importance. Above all, a power semiconductor device (power device) has been used in inverters for a railway vehicle, a hybrid car and an electric vehicle, an inverter for an air conditioner, and a power supply for a consumer appliance such as a personal computer. An improvement in the performance of the power semiconductor device contributes greatly to an improvement in power efficiency of an infrastructure system or a consumer appliance. Improving the power efficiency enables an energy resource necessary for the operation of a system to be reduced. In other words, a reduction in the emission amount of carbon dioxide, i.e., an environmental load can be reduced. Therefore, the research and development toward improving the performance of the power semiconductor device have been actively carried out by respective companies.

In general, a power semiconductor device uses silicon as a material in a manner similar to large scale integration (LSI). In recent years, however, silicon carbide (SiC) and gallium nitride (GaN) larger in bandgap than silicon are attracting attention. For example, since the silicon carbide is larger in bandgap than silicon, its insulation breakdown voltage is roughly 10 times that of silicon. From this viewpoint, a power semiconductor device with silicon carbide as a material can be made thinner in thickness than the power semiconductor device with silicon as the material, so that a resistance value (on resistance value) Ron during conduction can remarkably be reduced. Thus, the power semiconductor device with silicon carbide as the material is capable of greatly reducing a conduction loss (Ron$\times$i$^2$) represented by the product of the resistance value Ron and a conduction current i and contributes greatly to an improvement in the power efficiency. The development of a MOSFET, a schottky diode and a junction FET using silicon carbide as the material has been advanced at home and abroad by paying attention to the properties of such silicon carbide.

In particular, when attention is focused on a switching element (switching device), the commercialization of a junction FET (JFET) with silicon carbide as a material has been advanced quickly. Since the junction FET requires no gate insulating film comprised of, for example, a silicon oxide film when compared with the MOSFET with silicon carbide as the material, it is possible to avoid a defect at the interface between the silicon oxide film and silicon carbide, and a problem typified by degradation of element characteristics with the defect. Further, since the junction FET is capable of controlling the extension of a depletion layer due to a pn junction to control on/off of a channel, a normally-off junction FET and a normally-on junction FET can easily and separately be formed. Thus, when compared with the MOSFET with silicon carbide as the material, the junction FET with silicon carbide as the material is excellent even in long-term reliability and also has a feature to facilitate the manufacture of the power semiconductor device.

In the normally-on junction FET even in the junction FETs with silicon carbide as the material, the channel is normally turned on to allow current to flow therein. When it is necessary to turn off the channel, a negative voltage is applied to a gate electrode to extend the depletion layer from the pn junction and thereby turn off the channel. That is, the "normally-on field effect transistor" is a field effect transistor in which even when no gate voltage is applied, a channel exists and a drain current flows. Thus, when the normally-on junction FET is destroyed due to some cause, the current continues to flow with the channel on. It is normally desirable in terms of a fail-safe that the current does not flow when the junction FET is destroyed. The normally-on junction FET is however subject to the limitation of use because the current continues to flow even when the junction FET is destroyed. Thus, the normally-off junction FET is desired in terms of the fail-safe. Here, the "normally-off field effect transistor" is a field effect transistor in which when the gate voltage is not applied, a channel does not exist and a drain current does not flow.

However, the normally-off junction FET has the following problems. That is, the gate electrode and the source region of the junction FET respectively have a pn junction diode structure comprised of a p-type semiconductor region (gate electrode) and an n-type semiconductor region (source region). Therefore, when the voltage between the gate electrode and the source region reaches 3V or so, the parasitic diode between the gate electrode and the source region is turned on. As a result, a large current may flow between the gate electrode and the source region. Thus, heat is excessively generated in the junction FET to cause a possibility of destroying the junction FET. From this, it is desirable that in order to use the junction FET as the normally-off switching element, the gate voltage is limited to a low voltage of 2.5V or so, and the junction FET is used in a state in which the parasitic diode is not turned on or a state in which the diode current between the gate electrode and the source region is sufficiently small.

Incidentally, a gate voltage of 0 to 15V or 20V or so is applied in the normal MOSFET with silicon as the material. Therefore, in order to use the normally-off junction FET, there is a need to add a step-down circuit (DC/DC converter) for generating a voltage of 2.5V or so, a level conversion circuit, etc. in addition to the gate drive circuit for the existing MOSFET. This design change, i.e., the addition of parts results in an increase in the cost of the entire system.

From this viewpoint, the junction FET is provided which is excellent in long-term reliability and has the property of being easy to make, but is much different from the general MOSFET in terms of the gate voltage for its driving. Therefore, when the junction FET is newly used, a large design change including a drive circuit and the like is required, thereby resulting in the presence of a problem that the cost of the entire system rises.

As a method for solving this problem, a cascode coupling system is known. This cascode coupling system is a system in which a normally-on junction FET with silicon carbide as a material, and a low breakdown voltage MOSFET with silicon as a material are coupled in series. Since a gate drive circuit drives the low breakdown voltage MOSFET when such a coupling system is adopted, it is not necessary to change the gate drive circuit. On the other hand, the breakdown voltage between the drain and source can be determined by the property of the junction FET high in insulation breakdown voltage. Further, since the low on resistance of the junction FET and the low on resistance of the low breakdown voltage MOSFET are coupled in series even when the cascode coupling is done, the on resistance of the cascode-coupled switching element can also be suppressed relatively low. Thus, the cascode coupling system has a possibility of being capable of solving the problem of the normally-off junction FET. That is, the power semiconductor device that adopts the cascode coupling system has utility in terms of improving the performance of the power semiconductor device while suppressing a rise in the cost.

<Room for Improvement Corresponding to Large Increase in Current>

For example, the general current capacity of the power semiconductor device ranges from about 10 A to 20 A, but the power semiconductor device used in the hybrid vehicle or the like has been required to have a large current capacity in recent years. Specifically, a current capacity of 50 A or higher may be required. In order to allow the power semiconductor device to cope with such an increase in current capacity, there is a need to increase the size of each semiconductor chip included in the power semiconductor device. This applies even to the power semiconductor device using the cascode coupling system in like manner. That is, in order to increase the current capacity in the power semiconductor device of the cascode coupling system, there is a need to increase the size of a junction FET semiconductor chip and increase the size of a MOSFET semiconductor chip. According to the examinations of the present inventors, however, the junction FET semiconductor chip uses, for example, silicon carbide as the material and is larger in crystal defect (killer defect) than the MOSFET semiconductor chip with silicon as the material. From this, particularly when the size of the junction FET semiconductor chip is increased to make the current capacity large, the probability that the killer defects being fatal defects are formed in the junction FET semiconductor chip becomes high. This means that the proper product yield of the junction FET semiconductor chip is degraded. Thus, in the power semiconductor device using the cascode coupling system, when the manufacturing yield of the power semiconductor device is taken into consideration where the current capacity is made large, it is difficult to simply increase the size of the junction FET semiconductor chip. That is, in the power semiconductor device using the cascode coupling system, there exists room for its improvement in terms of coping with a large increase in current while improving the manufacturing yield thereof. Thus, in the present embodiment 1, the above room for improvement is given contrivances. A description will be made below about the technical idea in the present embodiment 1 given the contrivances.

<Configuration of Power Semiconductor Device According to Embodiment 1>

FIG. 1 is a diagram showing a circuit configuration of a power semiconductor device adopting a cascode coupling system, according to the present embodiment 1. As shown in FIG. 1, the power semiconductor device having adopted the cascode coupling system, according to the present embodiment 1 has a plurality of normally-on junction FETs Q1A and Q1B each provided between a source S and a drain D, and one normally-off MOSFET Q2. That is, as shown in FIG. 1, in the power semiconductor device according to the present embodiment 1, the junction FETs Q1A and Q1B are coupled in parallel with each other. Further, the parallel-coupled junction FETs Q1A and Q1B are coupled in series with one MOSFET Q2.

Specifically, as shown in FIG. 1, the junction FETs Q1A and Q1B are arranged on the drain D side, whereas one MOSFET Q2 is arranged on the source S side. That is, a source Sj of the junction FET Q1A is coupled to a drain Dm of the MOSFET Q2, and a source Sm of the MOSFET Q2 is coupled to a source S of the power semiconductor device. Further, a gate electrode Gj0 of the junction FET Q1A is coupled to the source S of the power semiconductor device. A gate electrode Gm of the MOSFET Q2 is coupled to a gate drive circuit (not shown).

Similarly, a source Sj of the junction FET Q1B is coupled to the drain Dm of the MOSFET Q2, and a gate electrode Gj1 of the junction FET Q1B is coupled to the source S of the power semiconductor device.

Such a coupling system as shown in FIG. 1 corresponds to the cascode coupling system in the present embodiment 1. According to the power semiconductor device that has adopted the cascode coupling system, according to the present embodiment 1, there can be obtained an advantage of making it unnecessary to make a change in the gate drive circuit from when a single MOSFET is used as the power semiconductor device, because the gate drive circuit (not shown) drives the gate electrode Gm of the MOSFET Q2. From this, according to the present embodiment 1, it is possible to suppress an increase in production cost because there is no need to provide a new gate drive circuit.

Further, since the junction FETs Q1A and Q1B respectively use a substance larger in bandgap than silicon as a material as typified by silicon carbide or gallium nitride, the insulation breakdown voltage of each of the junction FETs Q1A and Q1B becomes large. Therefore, the breakdown voltage of the cascode-coupled power semiconductor device is mainly determined by the characteristics of the junction FETs Q1A and Q1B. Thus, the insulation breakdown voltage required of the MOSFET Q2 coupled in series with the junction FETs Q1A and Q1B can be made lower than that for the power semiconductor device using the single MOSFET. That is, since a MOSFET of a low breakdown voltage (e.g., a few 10 volts or so) can be used as the MOSFET Q2 even if the insulation breakdown voltage is required as for the power semiconductor device, it is possible to reduce the on resistance of the MOSFET Q2. Further, since the FETs Q1A and Q1B are respectively comprised of a normally-on junction FET, the on resistances of the junction FETs Q1A and Q1B can also be reduced. As a result, according to the cascode-coupled power semiconductor device, it has an advantage that a design change in the gate drive circuit is made unnecessary. Further, securing the insulation resistance and a reduction in the on resistance can be made compatible. Consequently, it is possible to improve the electrical characteristics of the power semiconductor device.

Furthermore, as shown in FIG. 1, the cascode-coupled junction FETs Q1A and Q1B are of the normally-on junction FETs. The gate electrode Gj0 of the junction FET Q1A and the gate electrode Gj1 of the junction FET Q1B are both electrically coupled to the source S of the power semiconductor device. As a result, the voltage between the gate electrode Gj0 of the junction FET Q1A and the source S, and the voltage between the gate electrode Gj1 of the junction FET Q1B and the source S are not forward-biased at switching (turning-on). From this, since a large current due to a parasitic diode formed between each of the gate electrodes of the junction FETs Q1A and Q1B and the source does not flow in the cascode coupling in the present embodiment 1, it is possible to suppress breakdown of the power semiconductor device due to excessive heat generation. That is, in the normally-off junction FET, a positive voltage is applied to the gate electrodes Gj0 and Gj1 with respect to the source S at switching (turning-on). At this time, since source regions of the junction FETs Q1A and Q1B are respectively formed of an n-type semiconductor region, and the gate electrodes Gj0 and Gj1 are respectively formed of a p-type semiconductor region, the application of the positive voltage to the gate electrodes Gj0 and Gj1 with respect to the source S means that a forward voltage (forward bias) is applied between the source region and the gate electrode Gj0 and between the source region and the gate electrode Gj1. Therefore, in the normally-off junction FET, when the forward voltage is excessively increased, the parasitic diode comprised of the source region and the gate electrode Gj0, and the parasitic diode comprised of the source region and the gate electrode Gj1 are turned on. As a result, a large current may flow between the gate electrode Gj0 and the source region and between the gate electrode Gj1 and the source region, and the junction FET may result in breakdown with excessive heat generation.

Meanwhile, in the cascode-coupled power semiconductor device according to the present embodiment 1, the normally-on junction FETs Q1A and Q1B are used, and the gate electrode Gj0 and the gate electrode Gj1 are electrically coupled to the source S of the power semiconductor device. From this, the voltage between the gate electrode Gj0 of the junction FET Q1A and the source S, and the voltage between the gate electrode Gj1 of the junction FET Q1B and the source S are not forward-biased even at the switching (turning-on). Thus, since a large current due to the parasitic diode of each of the junction FETs Q1A and Q1B does not flow in the cascode connection in the present embodiment 1, it is possible to suppress breakdown of the power semiconductor device due to excessive heat generation.

<Features in the Embodiment 1>

A description will next be made about the feature point in the present embodiment 1. The feature point in the present embodiment 1 resides in that with, as an assumption, the circuit configuration in which the junction FETs Q1A and Q1B and one MOSFET Q2 are cascode-coupled as shown in FIG. 1, the junction FET Q1A is formed in a semiconductor chip CHP0, and the junction FET Q1B is formed in a semiconductor chip CHP1. In other words, the feature point in the present embodiment 1 resides in that the junction FET Q1A and the junction FET Q1B both coupled in parallel with each other are formed in the separate semiconductor chips. That is, the junction FET Q1A is formed in the semiconductor chip CHP0 having a substrate comprised of a semiconductor larger in bandgap than silicon. Further, the junction FET Q1B is formed in the semiconductor chip CHP1 having a different substrate comprised of a semiconductor larger in bandgap than silicon. On the other hand, the MOSFET Q2 is formed in a semiconductor chip CHP2 having a substrate comprised of silicon.

Thus, according to the present embodiment 1, the power semiconductor device of the cascode coupling system can be realized which deals with an increase in current while improving the manufacturing yield.

The reason for this will be described below. First, as shown in FIG. 1, the junction FETs Q1A and Q1B are coupled in parallel in the cascode coupling in the present embodiment 1. Therefore, the current flowing through the cascode-coupled power semiconductor device becomes the sum of the current flowing through the junction FET Q1A, and the current flowing through the junction FET Q1B, thereby making it possible to cope with the large current flow in the power semiconductor device. That is, since the current capacity can be made large in the cascode-coupled power semiconductor device according to the present embodiment 1, so that the power semiconductor device according to the present embodiment 1 can be applied even to, for example, applications for a hybrid vehicle and the like, which are large in current capacity.

On the other hand, in the present embodiment 1, the junction FET Q1A is formed in the semiconductor chip CHP0, and the junction FET Q1B is formed in the semiconductor chip CHP1. This means that the size of the semiconductor chip CHP0 and the size of the semiconductor chip CHP1 can be reduced.

If described specifically, for example, assume that the junction FET Q1A is comprised of 10,000 pieces of unit junction FETs, and the junction FET Q1B is also comprised of 10,000 pieces of unit junction FETs. At this time, when it is considered that the junction FETs Q1A and Q1B are formed in the single same semiconductor chip, the 20,000 pieces of unit junction FETs are formed in the same semiconductor chip. On the other hand, when the junction FET Q1A and the junction FET Q1B are formed in the separate semiconductor chips as in the case where the junction FET Q1A is formed in the semiconductor chip CHP0 and the junction FET Q1B is formed in the semiconductor chip CHP1, the number of unit junction FETs formed in each of the semiconductor chip CHP0 and the semiconductor chip CHP1 becomes 10,000 pieces.

That is, when the junction FET Q1A and the junction FET Q1B are formed in the single same semiconductor chip, it is necessary to form 20,000 pieces of unit junction FETs in the semiconductor chip. On the other hand, when the junction FET Q1A and the junction FET Q1B are formed in the separate semiconductor chips, 10,000 pieces of unit junction FETs equal to half of 20,000 pieces are formed in each of the separate semiconductor chips CHP0 and CHP1.

This means that the size of the semiconductor chip in which the junction FETs Q1A and Q1B are formed, becomes larger than the size of the semiconductor chip CHP0 and the size of the semiconductor chip CHP1, both chips having formed the junction FETs Q1A and Q1B separately. In other words, it means that the size of the semiconductor chip CHP0 and the size of the semiconductor chip CHP1, both chips having formed the junction FETs Q1A and Q1B separately, become smaller than the size of the semiconductor chip in which the junction FET Q1A and the junction FET Q1B are formed.

Thus, when the junction FET Q1A and the junction FET Q1B are formed in the separate semiconductor chips as in the present embodiment 1, an increase in the size of each individual semiconductor chip can be suppressed even while increasing the current capacity. Further, if the size of each individual semiconductor chip is made small, the manufacturing yield of the semiconductor chip is improved.

The reason for this will be described below. The junction FET semiconductor chip which forms each junction FET uses, as a material, a substance larger in bandgap than silicon. Specifically, as the substance larger in bandgap than silicon, there is known silicon carbide. The junction FET semiconductor chip can be formed of silicon carbide.

Here, a semiconductor wafer comprised of silicon carbide has more crystal defects than a semiconductor wafer comprised of silicon and hence has also many killer defects that influence the manufacturing yield. That is, since the technology using the silicon carbide is a technology which has begun to appear in recent years, the manufacturing technology is not so developed as the already-established technology using silicon. There is room for improvement in terms of manufacturing a semiconductor wafer having less crystal defects and high quality.

From this, in the semiconductor chip using silicon carbide as the material in particular, when the size of the semiconductor chip is increased, the probability that many fatal killer defects that influence the manufacturing yield are contained in the semiconductor chip becomes high. That is, as in the present embodiment 1, when the size of the junction FET semiconductor chip formed of silicon carbide is increased to enlarge the current capacity, corresponding to an increase in current, the probability that the killer defects are formed within the junction FET semiconductor chip becomes high. This means that the manufacturing yield of the junction FET semiconductor chip is degraded. Thus, increasing the size of the junction FET semiconductor chip formed of silicon carbide to make the current capacity large in correspondence with the increase in current is not reasonable in terms of improving the manufacturing yield.

Therefore, in the present embodiment 1, the junction FETs Q1A and Q1B coupled in parallel with each other are formed in the separate semiconductor chips as shown in FIG. 1. In this case, it is possible to suppress an increase in the size of the semiconductor chip CHP0 formed with the junction FET Q1A and an increase in the size of the semiconductor chip CHP1 formed with the junction FET Q1B. That is, in the present embodiment 1, even while increasing the total current capacity, the increases in the sizes of the individual semiconductor chips CHP0 and CHP1 can be suppressed by forming the junction FET Q1A in the semiconductor chip CHP0 and forming the junction FET Q1B in the semiconductor chip CHP1. Further, the reduction in the size of each of the individual semiconductor chips CHP0 and CHP1 means that the probability that the killer effects are contained in the semiconductor chips CHP0 and CHP1 becomes low as described above. This means that the manufacturing yields of the semiconductor chip CHP0 formed with the junction FET Q1A and the semiconductor chip CHP1 formed with the junction FET Q1B are improved.

From the above, according to the feature point in the present embodiment 1 that the junction FETs Q1A and Q1B coupled in parallel with each other are formed in the separate junction FET semiconductor chips, the power semiconductor device of the cascode coupling system can be realized which deals with the increase in current while improving the manufacturing yield of each individual junction FET semiconductor chip.

Incidentally, the junction FET semiconductor chips may be different in size from each other, but are desirably identical in size to each other. This is because when the sizes of the junction FET semiconductor chips are made identical to each other, mass productivity of the junction FET semiconductor chips can be improved. That is, when the sizes of the junction FET semiconductor chips are made different from each other, there is a need to provide manufacturing equipment corresponding to the respective sizes, thus leading to the complication of the manufacturing equipment. On the other hand, when the sizes of the junction FET semiconductor chips are made identical to each other, the manufacturing equipment is simplified and can thus be improved in mass productivity.

Further, when the sizes of the junction FET semiconductor chips are made different from each other, there exist the junction FET semiconductor chip having a relatively large size (first size), and the junction FET semiconductor chip having a relatively small size (second size). In this case, the probability that killer defects are contained in the junction FET semiconductor chip of the second size becomes smaller than the probability that killer defects are contained in the junction FET semiconductor chip of the first size. When the manufacturing yield of the entire power semiconductor device including the junction FET semiconductor chip of the first size and the junction FET semiconductor chip of the second size is however taken into consideration, the manufacturing yield of the entire power semiconductor device depends on the probability that the killer defects are contained in the junction FET semiconductor chip of the first size being of the relatively large size. That is, when the sizes of the junction FET semiconductor chips are made different from each other, the manufacturing yield of the entire power semiconductor device is determined depending on the manufacturing yield of the junction FET semiconductor chip having the relatively large size (first size).

On the other hand, when the sizes of the junction FET semiconductor chips are made identical to each other, the size (third size) of the junction FET semiconductor chip becomes larger than the above-described second size, but smaller than the above-described first size. Further, since the power semiconductor device is comprised of the junction FET semiconductor chips of the same size (third size), the manufacturing yield of the entire power semiconductor device depends on the probability that killer defects are contained in the junction FET semiconductor chip of the third size. That is, when the sizes of the junction FET semiconductor chips are made identical to each other, the manufacturing yield of the entire power semiconductor device is determined depending on the manufacturing yield of the junction FET semiconductor chip of the third size. At this time, since the third size is placed in the relationship of second size<third size<first size, the probability that the killer defects are contained in the junction FET semiconductor chip of the third size becomes smaller than the probability that the killer defects are contained in the junction FET semiconductor chip of the first size.

As a result, the configuration that the sizes of the junction FET semiconductor chips are made identical to each other provides that the manufacturing yield of the entire power semiconductor device can be improved, as compared with the configuration that the sizes of the junction FET semiconductor chips are made different from each other. From the above, considering the improvement in mass productivity and the improvement in the manufacturing yield of the entire power semiconductor device, it is understood that the sizes of the junction FET semiconductor chips are preferably made identical to each other rather than the sizes of the junction FET semiconductor chips being made different from each other.

Embodiment 2

The present embodiment 2 will next describe a mounting structure of a power semiconductor device in which the technical idea in the embodiment 1 has been embodied. Here, in the present embodiment 2, an improvement in the performance of the power semiconductor device is attained considering even room for improvement peculiar to the cascode coupling system upon embodying the technical idea in the embodiment 1. That is, the present embodiment 2 will describe the mounting structure in which the technical idea in the embodiment 1 is embodied, while improving the performance of the power semiconductor device of the cascode coupling system.

Before describing the mounting structure in which the technical idea in the embodiment 1 is embodied, a description will first be made about the room for improvement which exists to attain an improvement in the performance of the power semiconductor device of the cascode coupling system. First room for improvement and second room for improvement exist in this room for improvement. The first room for improvement and the second room for improvement will be described below in due order.
<First Room for Improvement>

The first room for improvement widely exists not only in the configuration example in which the junction FETs and one MOSFET are cascode-coupled as in the embodiment 1, but also in a general configuration example in which one junction FET and one MOSFET are cascode-coupled. Therefore, the first room for improvement will be described below by, for the safe of simplicity, taking for example the general configuration in which one junction FET and one MOSFET are cascode-coupled.

Figure 2:
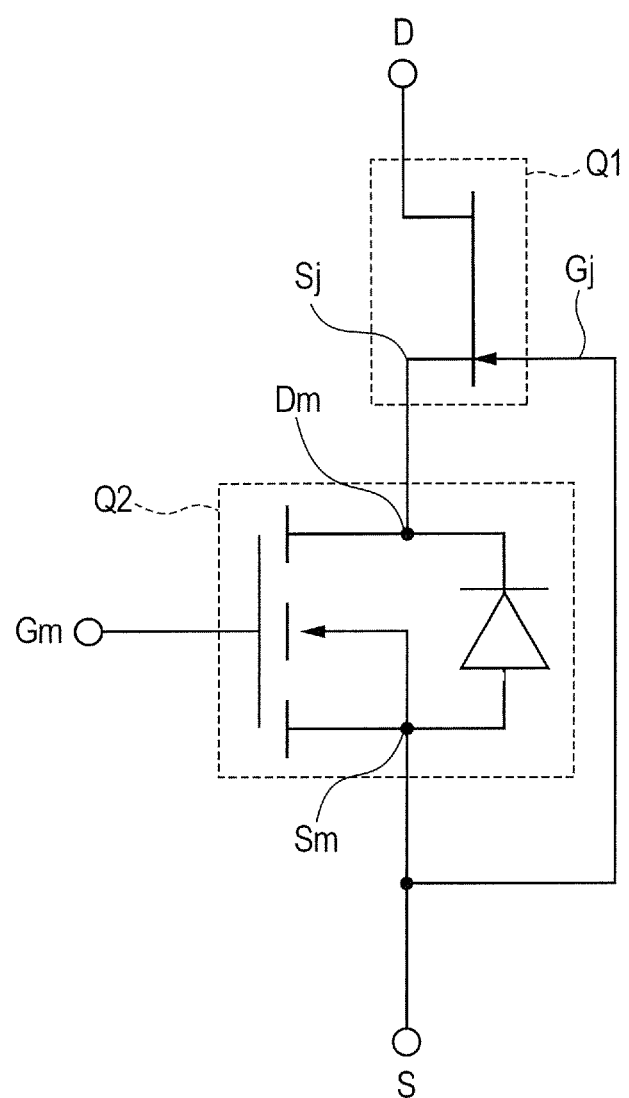
FIG. 2 is a diagram showing a circuit configuration of a power semiconductor device adopting a general cascode coupling system.

FIG. 2 is a diagram showing a circuit configuration of a power semiconductor device having adopted a general cascode coupling system. As shown in FIG. 2, the power semiconductor device having adopted the general cascode coupling system has a configuration in which a normally-on junction FET Q1 and a normally-off MOSFET Q2 are coupled in series between a source S and a drain D. Specifically, the junction FET Q1 is arranged on the drain D side, and the MOSFET Q2 is arranged on the source S side. That is, a source Sj of the junction FET Q1 is coupled to a drain Dm of the MOSFET Q2, and a source Sm of the MOSFET Q2 is coupled to the source S of the power semiconductor device. Further, a gate electrode Gj of the junction FET Q1 is coupled to the source S of the power semiconductor device, and a gate electrode Gm of the MOSFET Q2 is coupled to a gate drive circuit (not shown).

Incidentally, as shown in FIG. 2, a free wheel diode is coupled in antiparallel with the MOSFET Q2. The free wheel diode has the function of circulating a backward current to release energy stored in an inductance. That is, when the power semiconductor device is turned off where the power semiconductor device shown in FIG. 2 is coupled to a load including an inductance, a backward current in the direction opposite to the direction in which the current of the MOSFET Q2 flows is generated by the inductance included in the load. From this, the backward current is circulated by providing the free wheel diode in antiparallel with the MOSFET Q2 to release the energy stored in the inductance.

The first room for improvement will be described below. Specifically, in order to realize the cascode coupling shown in FIG. 2, there is a need to couple a semiconductor chip formed with the junction FET Q1 and a semiconductor chip formed with the low breakdown voltage MOSFET Q2 by bonding wires. Therefore, for example, the drain Dm of the low breakdown voltage MOSFET Q2 and the source Sj of the junction FET Q1 are coupled via the bonding wire. In this case, a parasitic inductance based on the bonding wire is added to the source Sj of the junction FET Q1. With such a parasitic inductance being added thereto, a large surge voltage is generated at the switching. Thus, a voltage more than the breakdown voltage is applied to the low breakdown voltage MOSFET Q2. As a result, there is a fear that the low breakdown voltage MOSFET Q2 is operated in an avalanche mode, so that a large current uncontrollable by the gate electrode Gm flows into the low breakdown voltage MOSFET Q2, thus resulting in a possibility of element breakdown. This point is the first room for improvement. A mechanism for causing the first room for improvement will be described in detail below.
<Mechanism for Causing First Room for Improvement>

FIG. 3A is a circuit diagram showing an inverter which uses the cascode-coupled junction FET and MOSFET shown in FIG. 2 as each switching element (power semiconductor device). The inverter shown in FIG. 3A has an upper arm UA and a lower arm BA coupled in series with a power supply VCC. The upper arm UA is comprised of a switching element coupled between a drain D1 and a source S1. The switching element which configures the upper arm UA is comprised of a junction FET Q1a and a MOSFET Q2a cascode-coupled. Specifically, a drain Dj1 of the junction FET Q1a is coupled to the drain D1 of the switching element, and a source Sj1 of the junction FET Q1a is coupled to a drain Dm1 of the MOSFET Q2a. Also, a source Sm1 of the MOSFET Q2a is coupled to the source S1 of the switching element. Further, a gate electrode Gj1 of the junction FET Q1a is coupled to the source S1 of the switching element, and a gate drive circuit (G/D) is coupled between a gate electrode Gm1 of the MOSFET Q2a and the source S1 of the switching element.

Here, a parasitic inductance Lse1 based on a bonding wire exists between the source Sj1 of the junction FET Q1a and the drain Dm1 of the MOSFET Q2a, and a parasitic inductance Lgi1 based on a bonding wire exists between the gate electrode Gj1 of the junction FET Q1a and the source S1 of the switching element. Incidentally, in FIG. 3A, the voltage between the source S1 of the switching element and the drain D1 of the switching element is defined as a voltage Vdsu, and the voltage between the source S1 of the switching element and the drain Dm1 of the MOSFET Q2a is defined as a voltage Vdsmu.

Similarly, as shown in FIG. 3A, the lower arm BA is comprised of a switching element coupled between a drain D2 and a source S2. The switching element which configures the lower arm BA is comprised of a junction FET Q1b and a MOSFET Q2b cascode-coupled. Specifically, a drain Dj2 of the junction FET Q1b is coupled to the drain D2 of the switching element, and a source Sj2 of the junction FET Q1b is coupled to a drain Dm2 of the MOSFET Q2b. Also, a source Sm2 of the MOSFET Q2b is coupled to the source S2 of the switching element. Further, a gate electrode Gj2 of the junction FET Q1b is coupled to the source S2 of the switching element, and a gate drive circuit (G/D) is coupled between a gate electrode Gm2 of the MOSFET Q2b and the source S2 of the switching element. Furthermore, a load inductance LL is coupled between the source S2 of the switching element and the drain D2 of the switching element.

Here, a parasitic inductance Lse2 based on a bonding wire exists between the source Sj2 of the junction FET Q1b and the drain Dm2 of the MOSFET Q2b, and a parasitic inductance Lgi2 based on a bonding wire exists between the gate electrode Gj2 of the junction FET Q1b and the source S2 of the switching element. Incidentally, in FIG. 3A, the voltage between the source S2 of the switching element and the drain D2 of the switching element is defined as a voltage Vak, and the voltage between the source S2 of the switching element and the drain Dm2 of the MOSFET Q2b is defined as a voltage Vdsmd.

The inverter using the cascode-coupled switching elements shown in FIG. 3 is configured as described above. The mechanism for causing the first room for improvement will be described below while describing the operation of the inverter. A description will first be made about the case where the switching element configuring the upper arm UA is turned on. That is, a description will be made about the case where the power supply voltage is applied to the load (including load inductance) by turning on the switching element configuring the upper arm UA and turning off the switching element configuring the lower arm BA.

FIG. 3B shows waveforms where the switching element configuring the upper arm UA is turned on. Specifically, since the junction FET Q1a and the MOSFET Q2a configuring the upper arm UA are turned on when the switching element configuring the upper arm UA is tuned on, a reflux current flows through a path from the drain Dj1 of the junction FET Q1a to the power supply VCC to which it returns through the load inductance LL by way of the drain Dm1 and source Sm1 of the MOSFET Q2a. At this time, as shown in FIG. 3B, the voltage Vdsmu is changed to 0V or so from a predetermined voltage, whereas the voltage Vak rises from 0V to the voltage of the power supply voltage or so when the switching element of the upper arm UA is being turned off. As a result, the voltage Vdsmd corresponding to the drain voltage of the MOSFET Q2b of the lower arm BA rises up to a voltage at which the junction FET Q1b of the lower arm BA is cut off. After the junction FET Q1b of the lower arm BA is turned off, a certain constant voltage is maintained. A change in the voltage Vdsmd is a change in ideal state that the parasitic inductance is negligible and is indicated by a broken line in FIG. 3B. When, however, the parasitic inductance Lse2 and the parasitic inductance Lgi2 are increased, the voltage Vdsmd suddenly rises greatly as indicated by a solid line in FIG. 3B when the switching element of the upper arm UA is turned on.

On the other hand, FIG. 3C shows waveforms where the switching element configuring the upper arm UA is turned off. Specifically, when the switching element configuring the upper arm UA is turned off, the voltage Vdsmd changes from a predetermined voltage to 0V or so as shown in FIG. 3C. On the other hand, the voltage Vdsu rises from 0V to the voltage of the power supply voltage or so when the switching element of the upper arm UA is being turned on. As a result, the voltage Vdsmu corresponding to the drain voltage of the MOSFET Q2a of the upper arm UA rises up to a voltage at which the junction FET Q1a of the upper arm UA is cut off. After the junction FET Q1a of the upper arm UA is turned off, a certain constant voltage is maintained. A change in the voltage Vdsmu is a change in an ideal state that the parasitic inductance is negligible and is indicated by a broken line in FIG. 3C. When, however, the parasitic inductance Lse1 and the parasitic inductance Lgi1 are increased, the voltage Vdsmu suddenly rises greatly as indicated by a solid line in FIG. 3C when the switching element of the upper arm UA is turned off.

Thus, it is understood that when the switching element of the upper arm UA is turned on, a phenomenon occurs in which the voltage Vdsmd corresponding to the drain voltage of the MOSFET Q2b of the lower arm BA to be turned off rises suddenly, and that when the switching element of the upper arm UA is turned off, a phenomenon occurs in which the voltage Vdsmu corresponding to the drain voltage of the MOSFET Q2a of the upper arm UA to be turned off rises suddenly. Since a mechanism for causing these phenomena is similar to the above, a description will be made below about a mechanism for causing the phenomenon in which the voltage Vdsmd corresponding to the drain voltage of the MOSFET Q2b of the lower arm BA to be turned off rises suddenly, while paying attention to the case where the switching element of the upper arm UA is turned on. As the mechanism for causing this phenomenon, there are considered three mechanisms to be next shown.

The first mechanism results from the parasitic inductance Lse2 which exists between the source Sj2 of the junction FET Q1b configuring the lower arm BA and the drain Dm2 of the MOSFET Q2b configuring the lower arm BA. Specifically, when the switching element of the upper arm UA is turned on, the MOSFET Q2b of the lower arm BA is turned off. At this time, the voltage Vak begins to increase from 0V or so, and the voltage Vdsmd corresponding to the drain voltage of the MOSFET Q2b of the lower arm BA also begins to increase with the increase in the voltage Vak. In the initial stage of increasing the voltage Vdsmd, however, the voltage Vdsmd is not made larger than the gate voltage applied to the gate electrode Gj2 of the junction FET Q1b beyond a predetermined value. Therefore, the junction FET Q1b is not cut off so that the current flows from the drain Dj2 of the junction FET Q1b to the source Sj2 thereof. As a result, the current flows into the drain Dm2 of the MOSFET Q2b where an electric charge is accumulated. From this, the voltage Vdsmd corresponding to the drain voltage of the MOSFET Q2b rises. Further, when the voltage Vdsmd continues to rise and becomes larger than the gate voltage of the junction FET Q1b by a predetermined value or more, the junction FET Q1b is cut off so that the current does not flow any more. That is, since in the initial stage of increasing the voltage Vdsmd, the current flows between the drain Dj2 of the junction FET Q1b and the source Sj2 thereof, and the electric charge is accumulated in the drain Dm2 of the MOSFET Q2b, the voltage Vdsmd increases. Thereafter, since the voltage Vdsmd approaches a state of becoming larger beyond a predetermined value than the gate voltage of the junction FET Q1b according to the increase in the voltage Vdsmd, the current flowing through the drain Dj2 and source Sj2 of the junction FET Q1b gradually decreases. Then finally, the junction FET Q1b is cut off by making the voltage Vdsmd larger beyond the predetermined value than the gate voltage of the junction FET Q1b. After the junction FET Q1b is cut off, the electric charge flowing into the drain Dm2 of the MOSFET Q2b does not appear and hence the voltage Vdsmd becomes substantially constant.

Thus, when the switching element of the upper arm UA is turned on, the MOSFET Q2b of the lower arm BA is turned off, but in this stage, the junction FET Q1b of the lower arm BA is not cut off immediately and hence the current flows from the drain Dj2 of the junction FET Q1b to the source Sj2 thereof. Then, the current having flowed into the source Sj2 of the junction FET Q1b flows into the drain Dm2 of the MOSFET Q2b through the parasitic inductance Lse2. At this time, the point to be noted resides in that the current flowing from the drain Dj2 of the junction FET Q1b of the lower arm BA to the source Sj2 thereof decreases. This means that the current flowing through the parasitic inductance Lse2 also decreases with time. As a result, such an electromotive force as to cancel the decrease in current occurs in the parasitic inductance Lse2. That is, the parasitic inductance Lse2 functions so as to increase the current flowing from the drain Dj2 of the junction FET Q1b to the source Sj2 thereof. Therefore, when the parasitic inductance Lse2 becomes large, a large current flows transiently from the drain Dj2 of the junction FET Q1b to the source Sj2 thereof. As a result, the electric charge flowing into the drain Dm2 of the MOSFET Q2b increases suddenly, whereby that the voltage Vdsmd increases suddenly. This corresponds to the first mechanism.

Then, the second mechanism results from the parasitic inductance Lgi2 which exists between the gate electrode Gj2 of the junction FET Q1b configuring the lower arm BA and the source S2 of the lower arm BA. Specifically, when the switching element of the upper arm UA is turned on, the MOSFET Q2b of the lower arm BA is turned off. At this time, the voltage Vak begins to increase from 0V or so, but vibrates to a range exceeding the power supply voltage in the initial stage at which the switching element of the upper arm UA is turned on, as shown in FIG. 3B, for example. This is based on a counter electromotive force caused by the load inductance LL included in the load coupled to the inverter. Accordingly, the voltage Vak fluctuates in the initial stage at which the upper arm UA is turned on. If attention is paid to the junction FET Q1b here, a parasitic capacitance is formed between the drain Dj2 of the junction FET Q1b and the gate electrode Gj2 thereof, and the voltage applied to the parasitic capacitance also varies when the voltage Vak fluctuates. Further, since the electrostatic capacitance value of the parasitic capacitance becomes a relatively large value, a charging/discharging current generated with the fluctuation in the voltage applied to the parasitic capacitance also becomes large. The charging/discharging current flows between the gate electrode Gj2 of the junction FET Q1b and the source S2 of the lower arm BA. At this time, the charging/discharging current is a current which temporally changes. Therefore, since the charging/discharging current which temporally changes flows through the parasitic inductance Lgi2 when the parasitic inductance Lgi2 exists between the gate electrode Gj2 of the junction FET Q1b and the source S2 of the lower arm BA, a resistive component proportional to the product of the magnitude of the parasitic inductance Lgi2 and a time differential of the charging/discharging current is generated between the gate electrode Gj2 of the junction FET Q1b and the source S2 of the lower arm BA. As a result, the gate electrode Gj2 of the junction FET Q1b and the source S2 of the lower arm BA are not brought to the same potential, so that there occurs a mode for setting the gate electrode Gj2 of the junction FET Q1b in the direction to rise to a positive voltage with respect to the source S2 of the lower arm BA. In this case, since the gate electrode Gj2 of the junction FET Q1b becomes the positive voltage, a depletion layer that extends from the gate electrode Gj2 of the junction FET Q1b is suppressed so that the width of a channel region is made large. Therefore, the current flowing from the drain Dj2 of the junction FET Q1b to the source Sj2 thereof becomes large transiently. As a result, the electric charge which flows into drain Dm2 of the MOSFET Q2b increases suddenly, whereby the voltage Vdsmd suddenly increases. This corresponds to the second mechanism. Further, according to the second mechanism, since the positive voltage is applied to the gate electrode Gj2 of the junction FET Q1b, a voltage larger than when 0V is applied to the gate electrode Gj2 must be applied the source Sj2 of the junction FET Q1b in order to cut off the junction FET Q1b. Even from this point of view, the voltage Vdsmd which rises until the junction FET Q1b is cut off becomes large.

Further, the third mechanism results from the parasitic resistance which exists between the gate electrode Gj2 of the junction FET Q1b configuring the lower arm BA and the source S2 of the lower arm BA. As described in the second mechanism, the charging/discharging current flows between the gate electrode Gj2 of the junction FET Q1b and the source S2 of the lower arm BA. From this, when the parasitic resistance exists between the gate electrode Gj2 of the junction FET Q1b and the source S2 of the lower arm BA, the charging/discharging current flows through the parasitic resistance so that a voltage drop is developed thereacross. As a result, the gate electrode Gj2 of the junction FET Q1b and the source S2 of the lower arm BA are not brought to the same potential, so that there occurs a mode for setting the gate electrode Gj2 of the junction FET Q1b in the direction to rise to a positive voltage with respect to the source S2 of the lower arm BA. Thus, in a manner similar to the second mechanism even in the case of the third mechanism, the gate electrode Gj2 of the junction FET Q1b becomes the positive voltage. Therefore, a depletion layer that extends from the gate electrode Gj2 of the junction FET Q1b is suppressed so that the width of a channel region is made large. Accordingly, the current flowing from the drain Dj2 of the junction FET Q1b to the source Sj2 thereof becomes large transiently. As a result, the electric charge which flows into drain Dm2 of the MOSFET Q2b increases suddenly, whereby the voltage Vdsmd suddenly increases.

Thus, it is understood that the voltage Vdsmd suddenly increases by the first to third mechanisms related to the parasitic inductance Lse2, the parasitic inductance Lgi2 and the parasitic resistance. Thus, when the parasitic inductance Lse2, the parasitic inductance Lgi2 and the parasitic resistance become large, the voltage Vdsmd corresponding to the drain voltage of the MOSFET Q2b of the lower arm BA rises up to a voltage greater than the breakdown voltage of the MOSFET Q2b, whereby the MOSFET Q2b of the lower arm BA is avalanche-operated, finally resulting in a possibility that the MOSFET Q2b of the lower arm BA will be broken down.

Although the general cascode coupling system shown in FIG. 2 has been described above by taking the examples, a description will be made below about, for example, a specific example in which attention is paid to the influence of the parasitic resistance taken up in the above-described third mechanism in the cascode coupling system of the embodiment 1 shown in FIG. 1.

Consider when the drain D is transitioned from a low potential to a high potential where the power semiconductor device of the cascode coupling system shown in FIG. 1 is in an off state, i.e., an off potential is applied to the gate electrode Gm. Since the junction FETs Q1A and Q1B are in an off state when the power semiconductor device of the cascode coupling system shown in FIG. 1 is in the off state, a source potential Sj is around +5V corresponding to an off voltage of each of the junction FETs Q1A and Q1B. Further, a gate potential of the gate electrode Gj0 of the junction FET Q1A, and a gate potential of the gate electrode Gj1 of the junction FET Q1B are respectively 0V. That is, the gate-to-source voltage of each of the junction FETs Q1A and Q1B is around −5V and in an off state. When the drain D is transitioned to the high potential when the power semiconductor device is in the off state, a displacement current from the drain D to the gate electrode Gj0 flows into the junction FET Q1A through its gate-to-drain capacitance. The displacement current flows from the gate electrode Gj0 of the junction FET Q1A to the source S via a gate wiring resistance rgj0 and a parasitic resistance Rgj0 existing inside the junction FET Q1A. Similarly, a displacement current from the drain D to the gate electrode Gj1 flows into the junction FET Q1B via its gate-to-drain capacitance. The displacement current flows from the gate electrode Gj1 of the junction FET Q1B to the source S via a gate wiring resistance rgj1 and a parasitic resistance Rgj1 existing inside the junction FET Q1B.

In this process, the gate potential of the gate electrode Gj0 of the junction FET Q1A rises by an integrated value of the displacement current and the gate resistance (gate wiring resistance rgj0+parasitic resistance Rgj0). For example, when the displacement current is 1 A and the value of the gate resistance is 50Ω, the gate potential of the junction FET Q1A rises by 50V with respect to the source potential of the MOSFET Q2. Similarly, the gate potential of the gate electrode Gj0 of the junction FET Q1B also rises by an integrated value of the displacement current and the gate resistance (gate wiring resistance rgj1+parasitic resistance Rgj1). For example, when the displacement current is 1 A and the value of the gate resistance is 50Ω, the gate potential of the junction FET Q1B rises by 50V with respect to the source potential of the MOSFET Q2.

Accordingly, the gate-to-source voltages of the junction FETs Q1A and Q1B change from −5V to +45V (=50V−5V), and the junction FETs Q1A and Q1B are transitioned from the off state to the on state. When the gate-to-source voltages of the junction FETs Q1A and Q1B are respectively brought to the on state at +45V, the electric charge is charged from the high-potential drain D to the drain Dm of the MOSFET Q2, i.e., the source Sj of each of the junction FETs Q1A and Q1B. With this charging operation, the drain potential of the MOSFET Q2 begins to rise from +5V. The rise in the drain potential of the MOSFET Q2 is continued until the junction FETs Q1A and Q1B are respectively brought to the off state. That is, the rise in the drain potential of the MOSFET Q2 is continued until the gate-to-source voltages of the junction FETs Q1A and Q1B reach around −5V. Accordingly, when the drain potential of the MOSFET Q2 becomes +55V and the gate potentials of the junction FETs Q1A and Q1B are respectively brought to a state of 50V, the rise in the drain potential of the MOSFET Q2 is stopped. Since, at this time, the source potential of the MOSFET Q2 is 0V, the drain-to-source voltage of the MOSFET Q2 becomes around 55V. That is, when a MOSFET having a breakdown voltage of 30V or so is selected for the MOSFET Q2 used in the power semiconductor device of the cascode coupling system shown in FIG. 1, the MOSFET Q2 is operated in the avalanche mode to cause a possibility that the MOSFET Q2 will be broken down.

Specifically, when the voltage greater than the breakdown voltage is applied to the MOSFET Q2, an electric field concentrated region is locally generated inside the MOSFET Q2, and electron-positive hole pairs by impact ionization are generated in this region in large quantities. A parasitic npn bipolar transistor formed by a source region (n-type semiconductor region), a channel forming region (p-type semiconductor region), and a drift region (n-type semiconductor region) is turned on by the electron-positive hole pairs generated in large quantities. In the MOSFET Q2 in which the parasitic npn bipolar transistor is turned on, a large current uncontrollable by the gate electrode Gm of the MOSFET Q2 flows to generate heat. Since, at this time, the electric resistance of the semiconductor region becomes small due to a rise in temperature due to the generation of heat, a positive feedback that a larger current flows occurs. As a result, the large current locally flows to cause the breakdown of the MOSFET Q2. This phenomenon is avalanche breakdown. The occurrence of such avalanche breakdown will result in degradation of reliability of the power semiconductor device.

Thus, even in the power semiconductor device of the cascode coupling system shown in FIG. 1, the MOSFET Q2 is avalanche-operated by the influence of the gate resistance (gate wiring resistance rgj0+parasitic resistance Rgj0) and the gate resistance (gate wiring resistance rgj1+parasitic resistance Rgj1) each being of the parasitic resistance, finally resulting in a possibility that the MOSFET Q2 will be broken down. Further, even in the power semiconductor device of the cascode coupling system shown in FIG. 1 in a manner similar to the general cascode coupling system shown in FIG. 2, the MOSFET Q2 is avalanche-operated depending on the influence of the parasitic inductance (LS0, LS1) due to the above-described first mechanism, and the parasitic inductance (Lgj1, Lgj2) due to the above-described second mechanism, finally resulting in a possibility that the MOSFET Q2 will be broken down. These points correspond to the first room for improvement.

<Second Room for Improvement>

A description will next be made about the second room for improvement. The second room for improvement is a problem peculiar to the cascode coupling system shown in FIG. 1. That is, the second room for improvement is a problem peculiar to a power semiconductor device in which a plurality of junction FETs and one MOSFET are cascode-coupled as in the case of the embodiment 1. That is, when a power semiconductor device of a cascode coupling system is configured using a plurality of FETs, there is a need to pay attention to such second room for improvement as shown below. Specifically, when the gate resistance (gate wiring resistance rgj1+parasitic resistance Rgj1) of another junction FET Q1B becomes large even if the gate resistance (gate wiring resistance rgj0+parasitic resistance Rgj0) of one junction FET Q1A or the parasitic inductance (Ls0, Lgj0) thereof is reduced where the junction FET Q1A and the junction FET Q1B exist, a surge voltage caused by the latter junction FET Q1B is generated by the above-described mechanism. Further, the latter junction FET Q1B is brought to the on state by the generated surge voltage. As a result, the source potential of the latter junction FET Q1B rises. Since the latter junction FET Q1B and the former junction FET Q1A are coupled in parallel, the source potential becomes a common potential. Therefore, the surge voltage caused by the latter junction FET Q1B is applied to the drain potential of the MOSFET Q2. Thus, when the power semiconductor device of the cascode coupling system is configured using the junction FETs, it is very important to equalize the magnitudes of the gate and/or source impedances of the junction FETs in addition to the gate and/or source impedances of the junction FETs being reduced, from the viewpoint of an improvement in the reliability of the power semiconductor device. This point corresponds to the second room for improvement.

Therefore, in the embodiment 2, the first room for improvement and the second room for improvement both described above are respectively given device while embodying the technical idea in the embodiment 1. That is, in the present embodiment 2, in order to suppress the application of the voltage greater than the insulation breakdown voltage to the MOSFET, which causes the avalanche breakdown, a contrivance for reducing the gate and source impedances of the junction FETs and setting them to a uniform value is applied. A technical idea in the present embodiment 2 to which this contrivance has been applied will be described below. The present embodiment 2 is characterized in that the mounting structure of the power semiconductor device of the cascode coupling system shown in FIG. 1 is given the contrivance. The mounting structure of the power semiconductor device including this feature point will be described below.

<Mounting Structure of Power Semiconductor Device According to the Embodiment 2>

Figure 4:
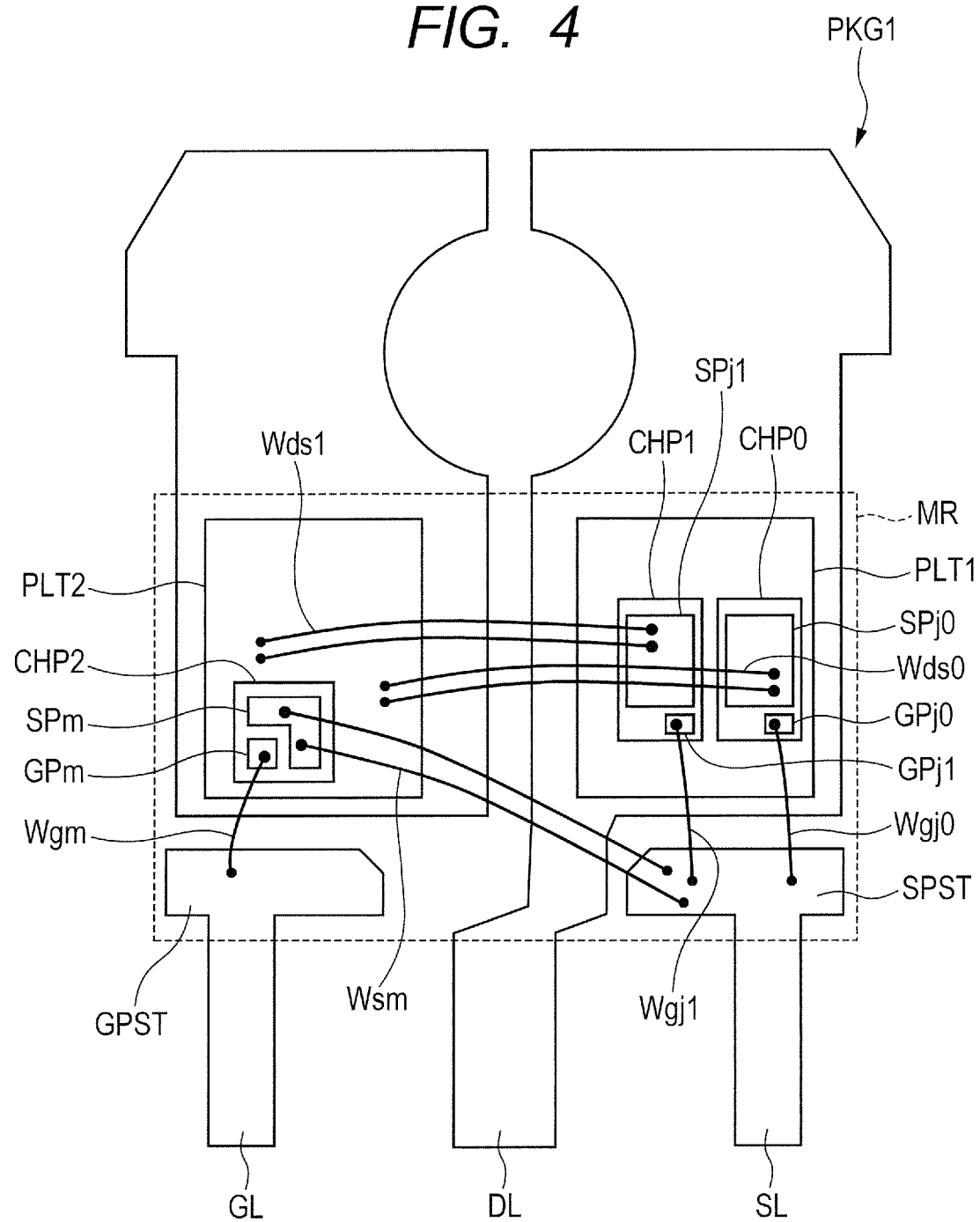
FIG. 4 is a diagram showing a mounting structure of a power semiconductor device according to an embodiment 2.

FIG. 4 is a diagram showing amounting structure (package configuration) of a power semiconductor device PKG1 according to the present embodiment 2. As shown in FIG. 4, the power semiconductor device PKG1 according to the present embodiment 2 has two chip mounting sections PLT1 and PLT2 separated from each other. In FIG. 4, the chip mounting section PLT1 and the chip mounting section PLT2 are respectively comprised of a metal plate, for example.

The chip mounting section PLT1 is formed integrally with a drain lead DL so to be coupled thereto. The chip mounting section PLT1 and the drain lead DL are electrically coupled to each other. Further, a source lead SL and a gate lead GL are arranged separately in such a manner that the drain lead DL is spacedly held therebetween. Specifically, as shown in FIG. 4, the source lead SL is separately arranged on the right side of the drain lead DL, and the gate lead GL is separately arranged on the left side of the drain lead DL. These drain lead DL, source lead SL and gate lead GL are electrically insulated from each other in the off state of the power semiconductor device. Further, a source lead post section SPST comprised of a wide area is formed at the tip portion of the source lead SL, and a gate lead post section GPST comprised of a wide area is formed at the tip portion of the gate lead GL.

Next, a semiconductor chip CHP0 and a semiconductor chip CHP1 are mounted over the chip mounting section PLT1 via, for example, a conductive adhesive comprised of silver paste or solder. The semiconductor chip CHP0 and the semiconductor chip CHP1 are respectively formed with, for example, junction FETs with silicon carbide as a material. Further, the back surfaces of the semiconductor chips CHP0 and CHP1 serve as drain electrodes respectively. On the other hand, a source pad SPj0 and a gate pad GPj0 are formed in the surface (main surface) of the semiconductor chip CHP0. Similarly, a source pad SPj1 and a gate pad GPj1 are formed in the surface (main surface) of the semiconductor chip CHP1. That is, the semiconductor chip CHP0 and the semiconductor chip CHP1 are respectively formed with, in a divided fashion, a plurality of junction FETs that configure a part of the power semiconductor device of the cascode coupling system shown in FIG. 1. At this time, the drain electrodes electrically coupled to the drains of the junction FETs are respectively formed in the back surfaces of the semiconductor chip CHP0 and the semiconductor chip CHP1. The source pad SPj0 electrically coupled to the source of each junction FET, and the gate pad GPj0 electrically coupled to the gate electrode of each junction FET are formed in the surface of the semiconductor chip CHP0. Likewise, the source pad SPj1 electrically coupled to the source of each junction FET, and the gate pad GPj1 electrically coupled to the gate electrode of each junction FET are formed in the surface of the semiconductor chip CHP1.

Subsequently, a semiconductor chip CHP2 is mounted over the chip mounting section PLT2 through, for example, a conductive adhesive comprised of silver paste or solder. The semiconductor chip CHP2 is formed with a MOSFET with silicon as a material, for example. At this time, the back surface of the semiconductor chip CHP2 serves as a drain electrode, and a source pad SPm and a gate pad GPm are formed in the surface (main surface) of the semiconductor chip CHP2. That is, the semiconductor chip CHP2 is formed with the MOSFET that configures a part of the power semiconductor device of the cascode coupling system shown in FIG. 1. Further, the drain electrode electrically coupled to the drain of the MOSFET is formed in the back surface of the semiconductor chip CHP2. On the other hand, the source pad SPm electrically coupled to a source of the MOSFET, and the gate pad GPm electrically coupled to a gate electrode of the MOSFET are formed in the surface of the semiconductor chip CHP2.

Then, the semiconductor chip CHP0 and the semiconductor chip CHP1 mounted over the chip mounting section PLT1, and the semiconductor chip CHP2 mounted over the chip mounting section PLT2 are coupled by bonding wires to thereby make it possible to configure the cascode-coupled power semiconductor device shown in FIG. 1.

Specifically, as shown in FIG. 4, the gate pad GPj0 formed in the surface of the semiconductor chip CHP0, and the source lead post section SPST formed at the tip portion of the source lead SL are electrically coupled by a wire Wgj0. Likewise, the gate pad GPj1 formed in the surface of the semiconductor chip CHP1, and the source lead post section SPST formed at the tip portion of the source lead SL are electrically coupled by a wire Wgj1. Further, the source pad SPj0 formed in the surface of the semiconductor chip CHP0, and the chip mounting section PLT2 are electrically coupled by a wire Wds0. Similarly, the source pad SPj1 formed in the surface of the semiconductor chip CHP1, and the chip mounting section PLT2 are electrically coupled by a wire Wds1.

Further, the source pad SPm formed in the surface of the semiconductor chip CHP2, and the source lead post section SPST formed at the tip portion of the source lead SL are electrically coupled by a wire Wsm.

Besides, the gate pad GPm formed in the surface of the semiconductor chip CHP2, and the gate lead post section GPST formed at the tip portion of the gate lead GL are electrically coupled by a wire Wgm.

Here, an area to which the wires Wgj0, Wgj1 and Wsm of the source lead post section SPST are coupled, and an area to which the wire Wgm of the gate lead post section GPST is coupled are respectively configured so as to be positioned at higher positions than the upper surface of the chip mounting section PLT1 and the upper surface of the chip mounting section PLT2, for example.

Incidentally, since the semiconductor chip CHP0 and the semiconductor chip CHP1 are mounted over the chip mounting section PLT1 through the conductive adhesive, the drain electrodes formed in the back surfaces of the semiconductor chips CHP0 and CHP1 are electrically coupled to the chip mounting section PLT1. Further, since the semiconductor chip CHP2 is mounted over the chip mounting section PLT2 through the conductive adhesive, the drain electrode formed in the back surface of the semiconductor chip CHP2 is electrically coupled to the chip mounting section PLT2.

In the power semiconductor device PKG1 according to the present embodiment 2, which has been configured in this way, parts of the semiconductor chip CHP0, the semiconductor chip CHP1, the semiconductor chip CHP2, and the chip mounting section PLT1, a part of the chip mounting section PLT2, a part of the drain lead DL, a part of the source lead SL, a part of the gate lead GL, and the wires Wgj0, Wgj1, Wds0, Wds1, Wgm, and Wsm are sealed by at least a sealing body MR (indicated by a broken line in FIG. 4). Thus, a part of the sealing body MR is arranged between the chip mounting section PLT1 and the chip mounting section PLT2, whereby the chip mounting section PLT1 and the chip mounting section PLT2 are electrically insulated by the sealing body MR.

The sealing body MR is formed in, for example, a rectangular parallelepiped shape and has a first side surface and a second side surface opposite to the first side surface. In this case, for example, a part of the drain lead DL, a part of the source lead SL, and a part of the gate lead GL are protruded from the first side surface of the sealing body. These protruded parts of the drain lead DL, source lead SL and gate lead GL function as external coupling terminals.

Here, since the three semiconductor chips of the semiconductor chip CHP0, the semiconductor chip CHP1, and the semiconductor chip CHP2 are mounted in the power semiconductor device PKG1 according to the present embodiment 2, the existing general-purpose package having only one chip mounting section within the power semiconductor device PKG1 cannot be diverted as it is. For example, a so-called vertical structure having drain electrodes at the back surfaces of semiconductor chips has been adopted for the junction FETs formed in the semiconductor chips CHP0 and CHP1 in the divided form and the MOSFET formed in the semiconductor chip CHP2, considering even the use thereof at a large rated current of a few A or more. At this time, in the power semiconductor device of the cascode coupling system, the drain electrodes formed in the back surfaces of the semiconductor chips CHP0 and CHP1, and the drain electrode formed in the back surface of the semiconductor chip CHP2 cannot be electrically coupled. From this, in the existing general-purpose package having only one chip mounting section within the power semiconductor device (package), when the semiconductor chip CHP0, the semiconductor chip CHP1, and the semiconductor chip CHP2 are arranged in this one chip mounting section, the drain electrodes formed in the back surfaces of the semiconductor chip CHP0 and the semiconductor chip CHP1, and the drain electrode formed in the back surface of the semiconductor chip CHP2 are electrically coupled, so that the power semiconductor device PKG1 of the cascode coupling system cannot be realized.

Therefore, in the present embodiment 2, as shown in FIG. 4, the power semiconductor device PKG1 is configured such that the two chip mounting sections PLT1 and PLT2 electrically insulated from each other are provided inside the sealing body MR with, as an assumption, its outer shape being equal to that of the general-purpose package. Further, the power semiconductor device PKG1 is configured in such a manner that the semiconductor chip CHP0 and the semiconductor chip CHP1 are mounted over the chip mounting section PLT1, and the semiconductor chip CHP2 is mounted over the chip mounting section PLT2. That is, the power semiconductor device PKG1 of the cascode coupling system is realized by providing the electrically-insulated two chip mounting sections PLT1 and PLT2 within the power semiconductor device PKG1, flatly arranging the semiconductor chip CHP0, the semiconductor chip CHP1, and the semiconductor chip CHP2, and coupling the flatly-arranged semiconductor chip CHP0, semiconductor chip CHP1 and semiconductor chip CHP2 by the wires.

Therefore, according to the power semiconductor device PKG1 according to the present embodiment 2, for example, an existing general-purpose package mounted with switching elements used in a power supply circuit or the like can be replaced with the power semiconductor device PKG1 according to the present embodiment 2, which is equivalent in outer shape to the existing general-purpose package. In particular, according to the power semiconductor device PKG1 of the present embodiment 2, since the drain lead DL, the source lead SL, and the gate lead GL are similar in arrangement to the general-purpose package, the general-purpose package can be replaced with the package PKG1 according to the present embodiment 2, and there is no need to design and change other drive circuits, wirings of a printed board, etc. Thus, according to the present embodiment 2, it is easy to change the switching elements using the general-purpose package to the switching elements of the high-performance cascode coupling system using the power semiconductor device PKG1 of the present embodiment 2. Consequently, according to the present embodiment 2, a high-performance power supply system can be provided without substantial design changes.

<Feature Points in the Embodiment 2>

A first feature point in the present embodiment 2 will next be described. As shown in FIG. 4, the first feature point in the present embodiment 2 resides in that the semiconductor chip CHP0 and the semiconductor chip CHP1 are mounted over the chip mounting section PLT1. Thus, there can be realized the technical idea of the embodiment 1 that the junction FET Q1A and the junction FET Q1B both shown in FIG. 1, which are coupled in parallel with each other, are formed in the separate junction FET semiconductor chips. That is, the junction FET Q1A shown in FIG. 1 is formed in the semiconductor chip CHP0 shown in FIG. 4, and the junction FET Q1B shown in FIG. 1 is formed in the semiconductor chip CHP1 shown in FIG. 4 to mount the separate semiconductor chips CHP0 and CHP1 formed with the junction FETs in the divided form over the chip mounting section PLT1. As a result, according to the power semiconductor device PKG1 according to the present embodiment 2, it is possible to reduce the sizes of the separate semiconductor chips CHP0 and CHP1. Therefore, the power semiconductor device PKG1 of the cascode coupling system can be provided which copes with an increase in current while improving the manufacturing yields of the semiconductor chip CHP0 and the semiconductor chip CHP1.

In particular, in the power semiconductor device PKG1 according to the present embodiment 2, the surface of the semiconductor chip CHP0 and the surface of the semiconductor chip CHP1 are identical to each other in layout configuration. Described in detail, as shown in FIG. 4, the arrangement position of the gate pad GPj0 of the semiconductor chip CHP0 is equal to the arrangement position of the gate pad GPj1 of the semiconductor chip CHP1, and the arrangement position of the source pad SPj0 of the semiconductor chip CHP0 is equal to the arrangement position of the source pad SPj1 of the semiconductor chip CHP1. Thus, the semiconductor chip CHP0 and the semiconductor chip CHP1 are made identical. As compared with the case where the layout configuration of the semiconductor chip CHP0 and the layout configuration of the semiconductor chip CHP1 are different from each other, the mass productivity can be enhanced. Incidentally, the terms "identical to each other" described herein means identicalness on the design idea, but does not mean physical identicalness in a strict sense. For example, when design ideas made identical in design drawings exist even if the strict physical identicalness is not satisfied due to manufacturing variations or the like, they are included in the concept of "identical to each other" described in the present specification. That is, the "identical to each other" described in the present specification may exist to include the design idea of being positively made identical, and is used with the intention of allowing inevitable manufacturing variations.

Subsequently, a second feature point of the present embodiment 2 resides in that a layout configuration is adopted which reduces the gate impedances of the junction FETs. Specifically, as shown in FIG. 4, the semiconductor chip CHP0 and the semiconductor chip CHP1 are respectively arranged at a position closest to the source lead SL of the drain lead DL, the source lead SL, and the gate lead GL. And further, the semiconductor chip CHP0 is arranged in such a manner that the gate pad GPj0 becomes closer to source lead SL than the source pad SPj0, and the semiconductor chip CHP1 is arranged in such a manner that the gate pad Gpj1 becomes closer to the source lead SL than the source pad SPj1. Thus, the length of the wire Wgj0 for coupling the gate pad GPj0 and the source lead SL can be made short, and the length of the wire Wgj1 for coupling the gate pad GPj1 and the source lead SL can be shortened. This means that the gate impedances of the junction FETs can be reduced. That is, the parasitic resistance Rgj0 and the parasitic inductance Lgj0 both shown in FIG. 1 are reduced by shortening the length of the wire Wgj0, and the parasitic resistance Rgj1 and the parasitic inductance Lgj1 both shown in FIG. 1 are reduced by shortening the wire Wgj1. As a result, according to the power semiconductor device PKG1 according to the present embodiment 2, since the gate impedances of the junction FETs can be reduced, the application of the voltage greater than the insulation breakdown voltage to the MOSFET due to an increase in the gate impedance of each of the junction FETs can be suppressed, thereby making it possible to effectively suppress avalanche breakdown of the cascode-coupled MOSFET.

Next, a third feature point in the present embodiment 2 resides in that the source impedance of each of the junction FETs is reduced. Specifically, as shown in FIG. 4, the source pad SPj0 of the semiconductor chip CHP0 and the chip mounting section PLT2 are electrically coupled by a plurality of wires Wds0, and the source pad SPj1 of the semiconductor chip CHP1 and the chip mounting section PLT2 are electrically coupled by a plurality of wires Wds1. As a result, the wires Wds0 enable the parasitic inductance LS0 shown in FIG. 1 to be reduced, and the wires Wds1 enable the parasitic inductance LS1 shown in FIG. 1 to be reduced. That is, according to the third feature point according to the present embodiment 2, the source impedances of the junction FETs can be reduced by using the wirers. From this, according to the power semiconductor device PKG1 according to the present embodiment 2, since the source impedances of the junction FETs can be reduced, the application of the voltage greater than the insulation breakdown voltage to the MOSFET due to an increase in the source impedance of each of the junction FETs can be suppressed, thereby making it possible to effectively suppress avalanche breakdown of the cascode-coupled MOSFET.

Subsequently, a fourth feature point in the present embodiment 2 resides in that the magnitudes of the gate impedances of the junction FETs and the source impedances thereof are equalized. Specifically, as shown in FIG. 4, the length of the wire Wgj0 for coupling the gate pad GPj0 and the source lead SL, and the length of the wire Wgj1 for coupling the gate pad GPj1 and the source lead SL are made identical to each other. Further, as shown in FIG. 4, the length of the wire Wds0 for coupling the source pad SPj0 and the chip mounting section PLT2, and the length of the wire Wds1 for coupling the source pad SPj1 and the chip mounting section PLT2 are made identical to each other.

Thus, it is possible to suppress variations in the gate impedances and source impedances of the junction FETs. Consequently, the gate and source impedances can be suppressed from extremely increasing in some junction FETs of the junction FETs. This means that the formation of the junction FETs larger than other junction FETs in terms of the gate and source impedances can be suppressed. As a result, it is possible to suppress degradation in the reliability of the power semiconductor device PKG1 due to the junction FETs extremely larger in the gate and source impedances. Incidentally, the term "identical to each other" also means identicalness on the design idea.

In the present embodiment 2 as described above, as shown in FIG. 4, the gate pad GPj0 provided in the surface of the semiconductor chip CHP0 formed with the junction FETs in the divided fashion, and the source lead SL are uniformly arranged so as to be as close to each other as possible. Similarly, in the semiconductor chip CHP1 formed with the junction FETs in the divided fashion, the gate pad GPj1 provided in the surface of the semiconductor chip CHP1, and the source lead SL are uniformly arranged so as to be as close to each other as possible. Specifically, in the present embodiment 2, the chip mounting section PLT1 mounted with the semiconductor chip CHP0 and the semiconductor chip CHP1 is arranged on the same side as the side at which the source lead SL is arranged with respect to the drain lead DL. Thus, the chip mounting section PLT1 can be made close to the source lead SL. This means that the semiconductor chip CHP0 and the semiconductor chip CHP1 mounted over the chip mounting section PLT1 can be arranged so as to approach the source lead SL.

Also in the present embodiment 2, the semiconductor chip CHP0 and the semiconductor chip CHP1 mounted over the chip mounting section PLT1 are uniformly arranged at the center of the chip mounting section PLT1. Thus, the semiconductor chip CHP0 and the semiconductor chip CHP1 can be arranged so as to be closest to the source lead SL and at equal distances.

Further, in the present embodiment 2, the semiconductor chip CHP0 and the semiconductor chip CHP1 are arranged so as to be as uniformly close to the source lead SL as possible. Further, the gate pad GPj0 formed in the surface of the semiconductor chip CHP0 and the gate pad GPj1 formed in the surface of the semiconductor chip CHP1 are arranged so as to uniformly approach the source lead SL.

Thus, in the present embodiment 2, the chip mounting section PLT1 mounted with the semiconductor chips CHP0 and CHP1 formed with the junction FETs is arranged at the position close to the source lead SL. Further, the semiconductor chip CHP0 and the semiconductor chip CHP1 are uniformly mounted in the area close to the source lead SL, of the internal area in the chip mounting section PLT1. Besides, in the present embodiment 2, the gate pad GPj0 formed in the surface of the semiconductor chip CHP0, and the gate pad GPj1 formed in the surface of the semiconductor chip CHP1 are arranged so as to uniformly approach the source lead SL. Thus, both the gate pad GPj0 formed in the surface of the semiconductor chip CHP0 and the gate pad GPj1 formed in the surface of the semiconductor chip CHP1 uniformly become close to the source lead SL. In other words, in the present embodiment 2, the gate pad GPj0 formed in the surface of the semiconductor chip CHP0, and the gate pad GPj1 formed in the surface of the semiconductor chip CHP1 are arranged so as to be closer to the source lead SL than other leads (drain lead DL and gate lead GL). As a result, according to the present embodiment 2, since the distance between the gate pad GPj0 and the source lead SL, and the distance between the gate pad GPj1 and the source lead SL can be shortened, both the length of the wire Wgj0 for coupling the gate pad GPj0 and the source lead SL, and the length of the wire Wgj1 for coupling the gate pad GPj1 and the source lead SL can uniformly be shortened.

In particular, in the present embodiment 2, since the configuration is adopted in which the wires Wgj0 and Wgj1 are coupled at the wide source lead post section SPST which exists at the tip portion close to the gate pads GPj0 and GPj1, of the source lead SL, the lengths of the wires Wgj0 and Wgj1 can further be shortened.

It means that the ability to shorten the length of the wire Wgj0 and the length of the wire Wgj1 enables reductions in the parasitic capacitances (parasitic resistance Rgj0 and parasitic resistance Rgj1 described in FIG. 1) that exist in the wires Wgj0 and Wgj1. That is, according to the present embodiment 2, the parasitic resistances respectively existing in the wires Wgj0 and Wgj1 can be reduced uniformly and sufficiently. From this, according to the power semiconductor device PKG1 according to the present embodiment 2, the application of the voltage greater than the insulation breakdown voltage to the cascode-coupled MOSFET can be suppressed, thereby making it possible to effectively suppress avalanche breakdown of the MOSFET. As a result, according to the present embodiment 2, the reliability of the power semiconductor device PKG1 can be improved.

A fifth feature point in the present embodiment 2 will be described subsequently. As shown in FIG. 4, the fifth feature point in the present embodiment 2 resides in that the gate pad GPm provided in the surface of the semiconductor chip CHP2 formed with the MOSFET, and the gate lead GL are arranged so as to be as close as possible. Specifically, in the present embodiment 2, the chip mounting section PLT2 mounted with the semiconductor chip CHP2 is arranged on the same side as the side at which the gate lead GL is arranged with respect to the drain lead DL. Thus, the chip mounting section PLT2 can be made close to the gate lead GL. This means that the semiconductor chip CHP2 mounted over the chip mounting section PLT2 can be arranged so as to approach the gate lead GL.

Further, in the present embodiment 2, the semiconductor chip CHP2 mounted over the chip mounting section PLT2 is arranged so as to approach the side closest to the gate lead GL of the chip mounting section PLT2 without arranging the semiconductor chip CHP2 at the center of the chip mounting section PLT2. Thus, the semiconductor chip CHP2 can be made arranged so as to come closest to the gate lead GL. Further, in the present embodiment 2, the semiconductor chip CHP2 is arranged so as to be as close to the gate lead GL as possible, and the gate pad GPm formed in the surface of the semiconductor chip CHP2 is arranged so as to approach the gate lead GL.

Thus, in the present embodiment 2, first, the chip mounting section PLT2 mounted with the semiconductor chip CHP2 formed with the MOSFET is arranged at the position close to the gate lead GL. Further, the semiconductor chip CHP2 is mounted to the area close to the gate lead GL, of the internal area in the chip mounting section PLT2. Besides, in the present embodiment 2, the gate pad GPm formed in the surface of the semiconductor chip CHP2 is arranged such that the gate pad GPm approaches the gate lead GL. Thus, the gate pad GPm formed in the surface of the semiconductor chip CHP2, and the gate lead GL become close to each other. In other words, in the present embodiment 2, the gate pad GPm formed in the surface of the semiconductor chip CHP2 is arranged so as to be closer to the gate lead GL than other leads (drain lead DL and source lead SL). As a result, according to the present embodiment 2, since the distance between the gate pad GPm and the gate lead GL can be shortened, the length of the wire Wgm for coupling the gate pad GPm and the gate lead GL can be shortened.

In particular, in the present embodiment 2, since the configuration is adopted in which the wire Wgm is coupled at the wide gate lead post section GPST which exists at the tip portion close to the gate pad GPm, of the gate lead GL, the length of the wire Wgm can further be shortened. Thus, according to the present embodiment 2, the parasitic inductance of the wire Wgm can be reduced. The ability to reduce the parasitic inductance of the wire Wgm contributes to an improvement in the electrical characteristics of the cascode-coupled power semiconductor device PKG1, but is not related directly to the suppression of the application of the voltage greater than the insulation breakdown voltage to the MOSFET. According to the configuration of the fifth feature point in the present embodiment 2, the application of the voltage greater than the insulation breakdown voltage to the MOSFET can be suppressed indirectly without being suppressed directly.

This point will be described below. As shown in FIG. 4, the fifth feature point in the present embodiment 2 resides in that the semiconductor chip CHP2 formed with the MOSFET is arranged so as to be as close to the gate lead GL as possible. This means that as shown in FIG. 4, the semiconductor chip CHP2 is arranged biasedly on the front side of the chip mounting section PLT2. In other words, it means that a large space in which the semiconductor chip CHP2 is not mounted can be formed on the deep side of the chip mounting section PLT2. Thus, in the present embodiment 2, there is an indirect feature in that the large space free of the mounting of the semiconductor chip CHP2 can be ensured at the chip mounting section PLT2. Specifically, according to this feature, as shown in FIG. 4, it is possible to sufficiently ensure a wire coupling area for electrically coupling the source pad SPj0 formed in the surface of the semiconductor chip CHP0 and the chip mounting section PLT2, and a wire coupling area for electrically coupling the source pad SPj1 formed in the surface of the semiconductor chip CHP1, and the chip mounting section PLT2. As a result, as shown in FIG. 4, it is possible to couple the source pad SPj0 and the chip mounting section PLT2 by a plurality of wires Wds0, and couple the source pad SPj1 and the chip mounting section PLT2 by a plurality of wires Wds1.

Here, the chip mounting section PLT2 is electrically coupled to the drain electrode formed in the back surface of the mounted semiconductor chip CHP2. Therefore, according to the present embodiment 2, the drain of the MOSFET and the sources of the junction FETs are coupled by the wires Wds0 and the wires Wds1. This means that the parasitic inductances (parasitic inductance Ls0 and parasitic inductance Ls1 shown in FIG. 1) of the wires Wds0 and Wds1 for coupling the drain of the MOSFET and the sources of the junction FETs can be reduced.

That is, according to the present embodiment 2, the parasitic inductances between the drain of the MOSFET and the sources of the junction FETs can sufficiently be reduced by using the wires Wds0 and Wds1. Thus, since the parasitic inductances can be reduced, it is possible to suppress a surge voltage generated due to the amount of change in switching current to be small. In other words, even if a MOSFET low (low in breakdown voltage) in on resistance is used, it is possible to suppress avalanche breakdown of the MOSFET because the surge voltage applied to the drain of the MOSFET is small, Further, as shown in FIG. 4, the formation position of the source pad SPj0 formed in the surface of the semiconductor chip CHP0, and the formation position of the source pad SPj1 formed in the surface of the semiconductor chip CHP1 are preferably arranged to be as close to the chip mounting section PLT2 as possible. This is because the length of the wire Wds0 for coupling the source pad SPj0 and the chip mounting section PLT2, and the length of the wire Wds1 for coupling the source pad SPj1 and the chip mounting section PLT2 can be made as short as possible by arranging the source pad SPj0 and the source pad Spj1 in this way. Even by this, the parasitic inductances (parasitic inductance Ls0 and parasitic inductance Ls1 shown in FIG. 1) of the wires Wds0 and Wds1 for coupling the drain of the MOSFET and the sources of the junction FETs can be reduced.

From the above, according to the fifth feature point in the present embodiment 2, it is possible to suppress the application of the voltage greater than the insulation breakdown voltage to the MOSFET. Thus, the avalanche breakdown of the cascode-coupled MOSFET can effectively be suppressed. As a result, according to the present embodiment 2, it is possible to improve the reliability of the semiconductor device.

Incidentally, in the present embodiment 2, as shown in FIG. 4, the gate pad GPj0 is electrically coupled to the source lead SL by the wire Wgj0, and the gate pad GPj1 is electrically coupled to the source lead SL by the wire Wgj1. Further, the gate pad GPm is electrically coupled to the gate lead GL by the wire Wgm.

At this time, the thickness (width) of the wire Wgj0 and the thickness (width) of the wire Wgj1 are desirably made thicker than the thickness (width) of the wire Wgm. This is because when the parasitic resistances existing in the wire Wgj0 and wire Wgj1 become large, the voltage greater than the insulation breakdown voltage is applied to the drain of the MOSFET as described above. Therefore, from the viewpoint of reducing the parasitic resistances existing in the wires Wgj0 and Wgj1, the thickness of the wire Wgj0 and the thickness of the wire Wgj1 are desirably made thicker than the thicknesses of other wires. Thus, the parasitic resistance between the gate electrode of each of the junction FETs and the source (which can also be defined as the source of the MOSFET) of the power semiconductor device PKG1 can be reduced. From this, according to the power semiconductor device PKG1 according to the present embodiment 2, the application of the voltage greater than the insulation breakdown voltage to the MOSFET can be suppressed, thereby making possible to effectively suppress the avalanche breakdown of the cascode-coupled MOSFET. As a result, according to the present embodiment 2, the reliability of the semiconductor device can be improved.

Next, a sixth feature point in the present embodiment 2 will be described. The sixth feature point in the present embodiment 2 resides in that as shown in FIG. 4, the source pad SPm provided in the surface of the semiconductor chip CHP2 formed with the MOSFET, and the source lead SL (source lead post section SPST) are coupled by a plurality of wires Wsm.

Thus, the parasitic capacitance and parasitic inductance between the source of the MOSFET and the source lead SL can be reduced. As a result, the potential of the source of the MOSFET can be suppressed from varying from a GND potential (reference potential) supplied from the source lead SL, so that the source of the MOSFET can securely be fixed to the GND potential. Further, since the parasitic resistance between the source of the MOSFET and the source lead SL is reduced, the on resistance of the cascode-coupled power semiconductor device PKG1 can also be reduced. Thus, according to the sixth feature point in the present embodiment 2, the electrical characteristics of the power semiconductor device PKG1 can be improved.

As described above, according to the power semiconductor device PKG1 according to the present embodiment 2, the application of the voltage greater than the insulation breakdown voltage to the MOSFET can be suppressed by providing the above-described first to six feature points, thereby making it possible to effectively suppress the avalanche breakdown of the cascode-coupled MOSFET. As a result, it is possible to improve the reliability of the power semiconductor device PKG1 according to the present embodiment 2. Further, since the power semiconductor device PKG1 according to the present embodiment 2 is capable of reducing the parasitic resistance and the parasitic inductance, the electrical characteristics of the power semiconductor device PKG1 can be improved.

Further, for example, advantageous effects to be shown below can be obtained as specific effects accompanying the power semiconductor device PKG1 according to the present embodiment 2. That is, since the power semiconductor device PKG1 according to the present embodiment 2 adopts the configuration in which the semiconductor chips CHP0 and CHP1 formed by dividing the junction FETs, and the semiconductor chip CHP2 formed with the MOSFET are planarly arranged, the areas of the semiconductor chip CHP0, semiconductor chip CHP1 and semiconductor chip CHP2 can be freely designed. From this, the design of a low on resistance, and the design of an on-state current density also become easy, and a power semiconductor device PKG1 with various specifications can be realized.

Modification 1

In the power semiconductor device PKG1 according to the embodiment 2, there has been described the example having the separate semiconductor chips CHP0 and CHP1 formed with the junction FETs in the divided fashion. On the other hand, the present modification 1 will describe a power semiconductor device PKG2 having separate semiconductor chips CHP0, CHP1, and CHP3 formed with a plurality of junction FETs in a divided fashion.

Figure 5:
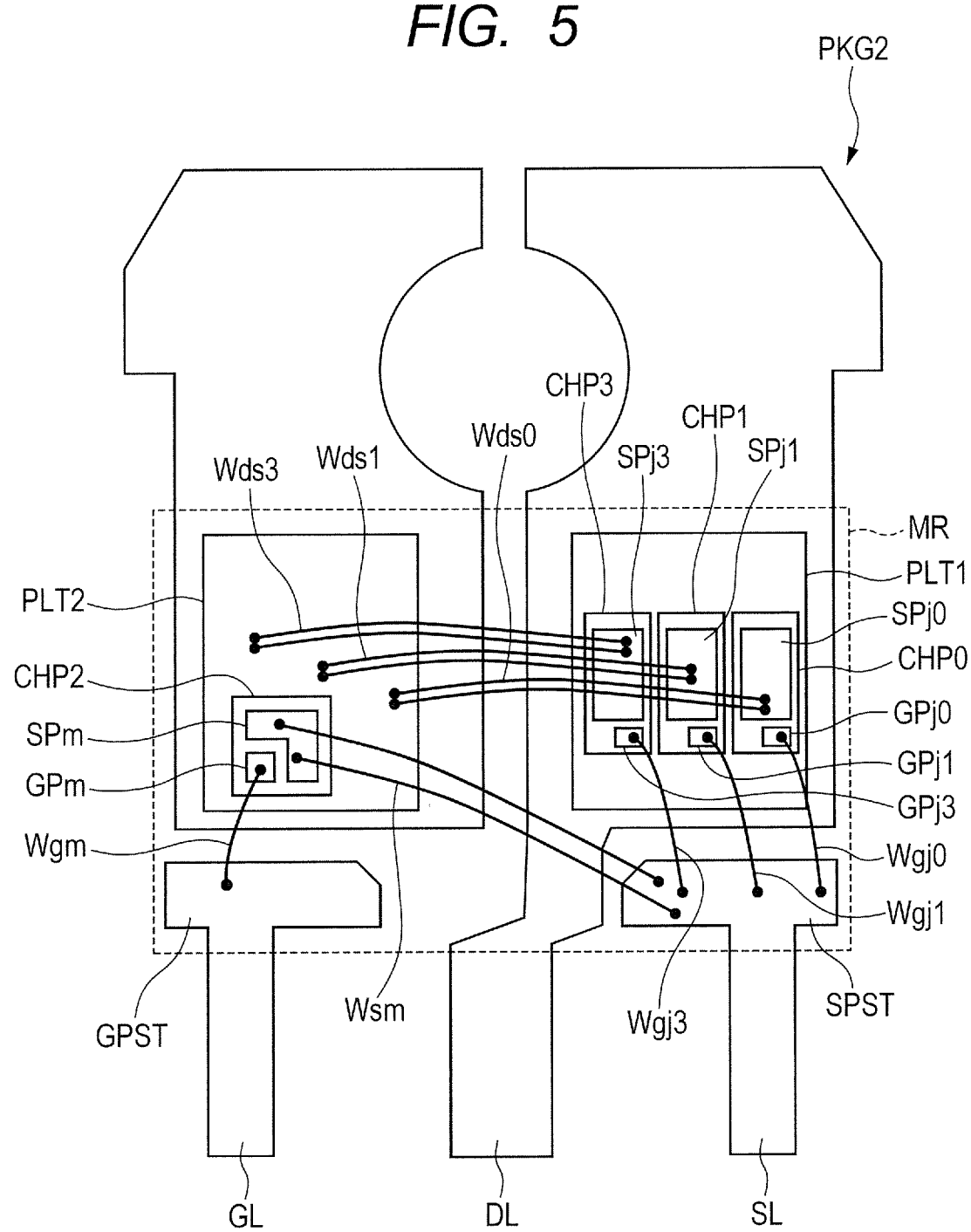
FIG. 5 is a diagram showing a mounting structure of a power semiconductor device according to a modification 1.

FIG. 5 is a diagram showing a mounting structure of the power semiconductor device PKG2 according to the present modification 1. In FIG. 5, in the modification 1, the semiconductor chip CHP0, the semiconductor chip CHP1, and the semiconductor chip CHP3 are mounted over a chip mounting section PLT1. The junction FETs are formed in these semiconductor chips CHP0, CHP1, and CHP3 in the divided fashion.

A source pad SPj0 and a gate pad GPj0 are formed in the surface of the semiconductor chip CHP0. A source pad SPj1 and a gate pad GPj1 are formed in the surface of the semiconductor chip CHP1. A source pad SPj3 and a gate pad GPj3 are formed in the surface of the semiconductor chip CHP3.

Then, the gate pad GPj0 and a source lead SL are coupled by a wire Wgj0, and the gate pad GPj1 and the source lead SL are coupled by a wire Wgj1. Likewise, the gate pad GPj3 and the source lead SL are coupled by a wire Wgj3.

Further, the source pad SPj0 and a chip mounting section PLT2 are coupled by wires Wds0, and the source pad SPj1 and the chip mounting section PLT2 are coupled by wires Wds1. Likewise, the source pad SPj3 and the chip mounting section PLT2 are coupled by wires Wds3.

According to the power semiconductor device PKG2 according to the present modification 1 configured in this way, since the junction FETs are formed in the three semiconductor chips (semiconductor chip CHP0, semiconductor chip CHP1, and semiconductor chip CHP3) in the divided fashion, the sizes of the respective semiconductor chips can further be reduced. Therefore, according to the power semiconductor device PKG2 according to the present modification 1, the probability that killer defects are contained in each semiconductor chip can be reduced, thereby making it possible to improve the manufacturing yield of each semiconductor chip.

Modification 2

Next, a description will be made about a mounting structure of a power semiconductor device PKG3 according to the present modification 2. The present modification 2 will describe an example in which one of two semiconductor chips formed with a plurality of junction FETs in a divided fashion, and a semiconductor chip formed with a MOSFET are laminated over each other.

Figure 6:
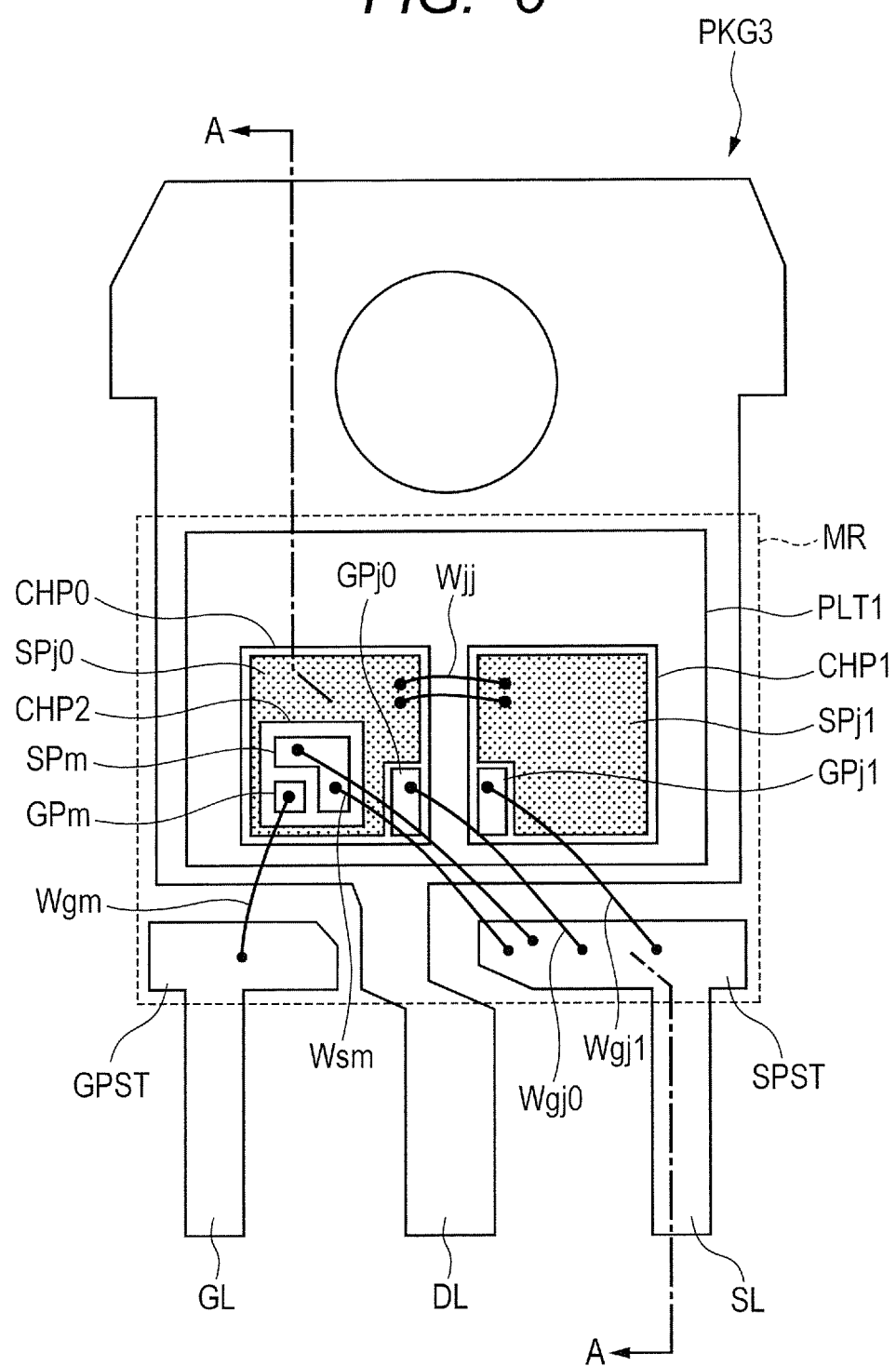
FIG. 6 is a diagram showing a mounting structure of a power semiconductor device according to a modification 2.

FIG. 6 is a diagram showing a mounting structure of the power semiconductor device PKG3 according to the present modification 2. In FIG. 6, the power semiconductor device PKG3 according to the present modification 2 has a chip mounting section PLT1 comprised of, for example, a rectangular-shaped metal plate. The chip mounting section PLT1 is formed integrally with a drain lead DL so as to be coupled thereto. The chip mounting section PLT1 and the drain lead DL are electrically coupled to each other. Further, a source lead SL and a gate lead GL are arranged in such a manner that the drain lead DL is spacedly held therebetween.

Next, a semiconductor chip CHP0 and a semiconductor chip CHP1 are mounted over the chip mounting section PLT1 via, for example, a conductive adhesive comprised of silver paste or solder. The semiconductor chip CHP0 and the semiconductor chip CHP1 are respectively formed with, for example, junction FETs with silicon carbide as a material. Further, the back surfaces of the semiconductor chips CHP0 and CHP1 serve as drain electrodes respectively. On the other hand, a source pad SPj0 and a gate pad GPj0 are formed in the surface (main surface) of the semiconductor chip CHP0. A source pad SPj1 and a gate pad GPj1 are formed in the surface of the semiconductor chip CHP1.

Here, the gate pad GPj0 and the source lead SL are coupled by a wire Wgj0, and the gate pad GPj1 and the source lead SL are coupled by a wire Wgj1. Further, the source pad SPj0 and the source pad SPj1 are coupled by wires Wjj.

Then, a semiconductor chip CHP2 is mounted over the semiconductor chip CHP0 via a conductive adhesive comprised of, for example, silver paste or solder. The semiconductor chip CHP2 is formed with a MOSFET with silicon as a material. At this time, the back surface of the semiconductor chip CHP2 serves as a drain electrode, and a source pad SPm and a gate pad GPm are formed in the surface of the semiconductor chip CHP2.

Thus, in the present modification 2, the semiconductor chip CHP2 is mounted over the semiconductor chip CHP0. In particular, as shown in FIG. 6, the semiconductor chip CHP2 is mounted over the source pad SPj0 formed in the surface of the semiconductor chip CHP0. Thus, the drain electrode formed in the back surface of the semiconductor chip CHP2, and the source pad SPj0 formed in the surface of the semiconductor chip CHP0 are electrically coupled to each other. As a result, the source of each junction FET formed in the semiconductor chip CHP0 and the drain of the MOSFET formed in the semiconductor chip CHP2 are electrically coupled.

From this, as shown in FIG. 6, the semiconductor chip CHP2 needs to be formed so as to be included in the source pad SPj0 formed in the surface of the semiconductor chip CHP0 in plan view. That is, in the present modification 2, the size of the semiconductor chip CHP2 needs to be smaller than the size of the semiconductor chip CHP0. To say more, the size of the semiconductor chip CHP2 needs to be smaller than the size of the source pad SPj0. Further, the gate pad GPm and the gate lead GL are coupled by a wire Wgm, and the source pad SPm and the source lead SL are coupled by a wire Wsm.

Figure 7:
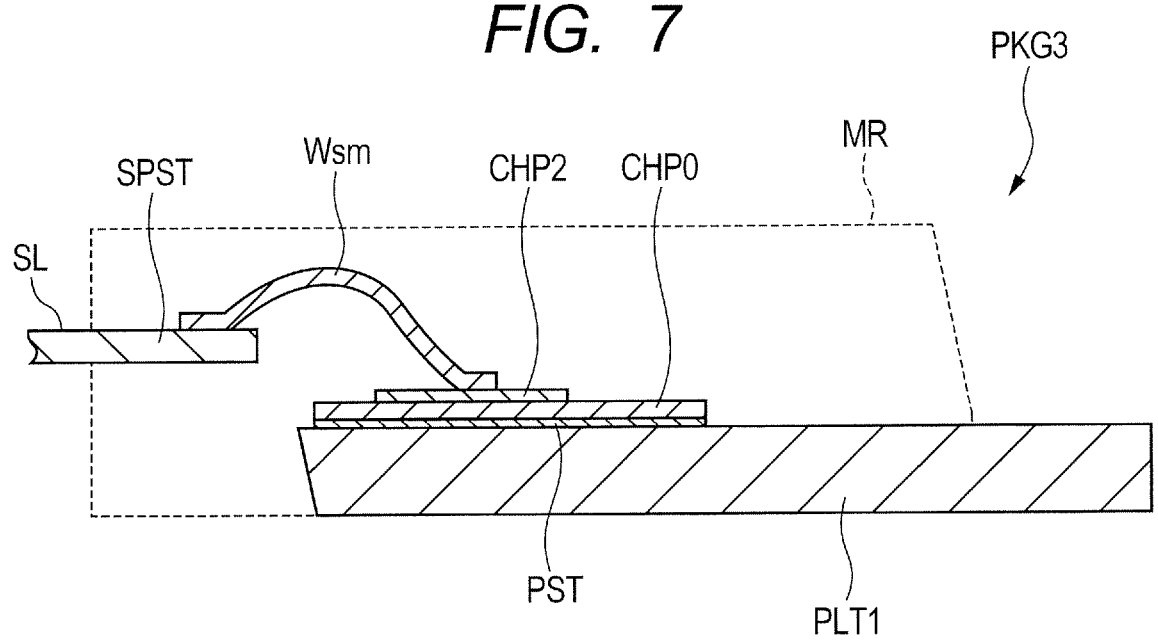
FIG. 7 is a typical diagram showing a cross-section of the power semiconductor device according to the modification 2 and a sectional diagram cut along line A-A of FIG. 6.

FIG. 7 is a typical diagram showing a cross-section of the power semiconductor device PKG3 according to the modification 2 and a sectional diagram cut along line A-A of FIG. 6. As shown in FIG. 7, the semiconductor chip CHP0 is mounted over the chip mounting section PLT1 through a conductive adhesive PST interposed therebetween. The semiconductor chip CHP2 is mounted over the semiconductor chip CHP0 through a conductive adhesive (not shown). Further, the semiconductor chip CHP2 (source pad) and the source lead SL are electrically coupled by the wire Wsm. Incidentally, a broken line part shown in FIG. 7 indicates a part covered with a sealing body MR.

Subsequently, a feature point peculiar to the power semiconductor device PKG3 according to the present modification 2 will be described. The feature point peculiar to the present modification 2 resides in that as shown in FIG. 6, the semiconductor chip CHP2 formed with the MOSFET is mounted over the semiconductor chip CHP0 formed with a part of the junction FETs. Thus, the source pad SPj0 formed in the surface of the semiconductor chip CHP0 and the drain electrode formed in the back surface of the semiconductor chip CHP2 can directly be coupled. That is, according to the present modification 2, it is possible to directly couple the source of the junction FET formed in the semiconductor chip CHP0 and the drain of the MOSFET formed in the semiconductor chip CHP2 without using the wire. This means that the parasitic inductance interposed between the source of the junction FET and the drain of the MOSFET can be almost completely eliminated. That is, the feature point peculiar to the present modification 2 resides in that the semiconductor chip CHP2 is mounted directly on the semiconductor chip CHP0. Since the source of the junction FET formed in the semiconductor chip CHP0 and the drain of the MOSFET formed in the semiconductor chip CHP2 are coupled by this configuration, no wire is required. When the wire is used, the parasitic inductance existing in the wire comes to the problem. According to the present modification 2, however, since the source of the junction FET formed in the semiconductor chip CHP0 and the drain of the MOSFET formed in the semiconductor chip CHP2 can be directly coupled without using the wire, the parasitic inductance (parasitic inductance Ls0 in FIG. 1) between the drain of the MOSFET formed in the semiconductor chip CHP2 and the source of the junction FET formed in the semiconductor chip CHP0 can be almost completely eliminated. On the other hand, in the present modification 2, the semiconductor chip CHP0 and the semiconductor chip CHP1 are arranged closely, and the source pad SPj0 and the source pad SPj1 are electrically coupled by the wires Wjj. Thus, according to the present modification 2, the parasitic inductance (parasitic inductance Ls1 in FIG. 1) of each wire Wjj can be suppressed to minimum.

From the above, according to the power semiconductor device PKG3 according to the present modification 2, it is possible to suppress a surge voltage generated with an increase/decrease in switching current. In other words, the application of the voltage greater than the insulation breakdown voltage to the MOSFET can be suppressed, thereby making it possible to effectively suppress avalanche breakdown of the cascode-coupled MOSFET. As a result, according to the present modification 2, the reliability of the power semiconductor device PKG3 can be improved.

In the power semiconductor device PKG3 according to the present modification 2, the semiconductor chip CHP0 and the semiconductor chip CHP2 are arranged in lamination over the chip mounting section PLT1. From this, in the power semiconductor device PKG3 according to the present modification 2, the existing general-purpose package having only one chip mounting section within the package can be diverted as it is. That is, according to the power semiconductor device PKG3 according to the present modification 2, since the so-called inexpensive general-purpose package can be diverted as it is, the cascode-coupled high-performance power semiconductor device PKG3 can be provided at low cost. In other words, according to the present modification 2, it is possible to reduce the cost of the cascode-coupled high-performance power semiconductor device PKG3.

Figure 8:
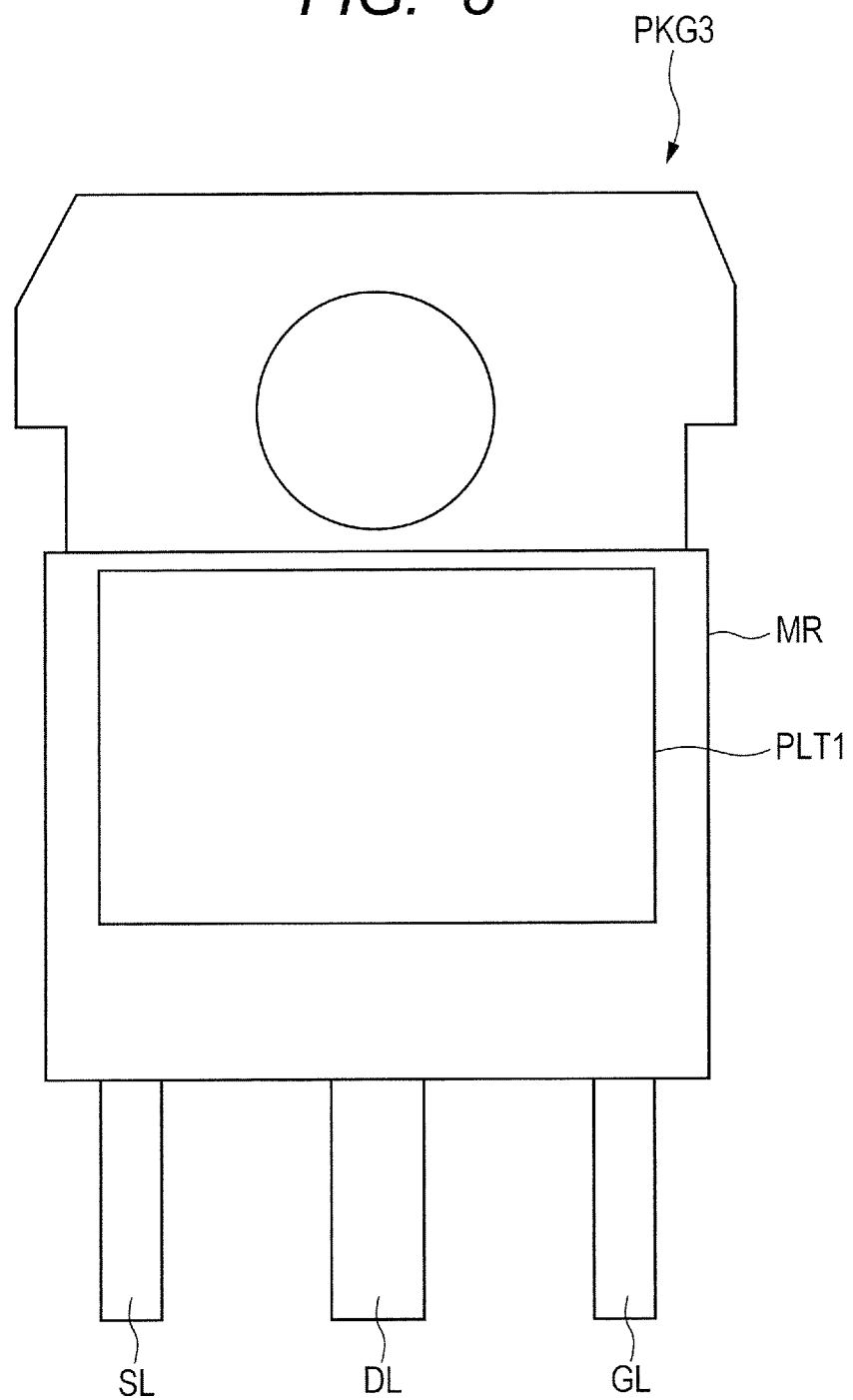
FIG. 8 is a diagram of the power semiconductor device according to the modification 2 as viewed from the lower surface side of a sealing body MR.

Further, according to the present modification 2, there can also be obtained an advantage that the mounting area of each semiconductor chip can be reduced because the semiconductor chip CHP0 and the semiconductor chip CHP2 are laminated over each other. In this case in particular, as shown in FIG. 6, heat generated in the semiconductor chip CHP0, the semiconductor chip CHP1, and the semiconductor chip CHP2 can efficiently be diffused because a large space can be secured for the chip mounting section PLT1. Further, in the present modification 2, the lower surface of the chip mounting section PLT1 can be configured to be exposed from the sealing body MR. FIG. 8 is a diagram of the power semiconductor device PKG3 according to the present modification 2 as viewed from the lower surface side of the sealing body MR. As shown in FIG. 8, in the power semiconductor device PKG3 according to the present medication 2, it is understood that the lower surface of the chip mounting section PLT1 is configured to be exposed from the sealing body MR. In this case, according to the power semiconductor device PKG3 according to the present modification 2, for example, heat generated in each semiconductor chip (semiconductor chip CHP0, semiconductor chip CHP1, semiconductor chip CHP2) can efficiently be diffused from the lower surface of the chip mounting section PLT1.

Modification 3

Figure 9:
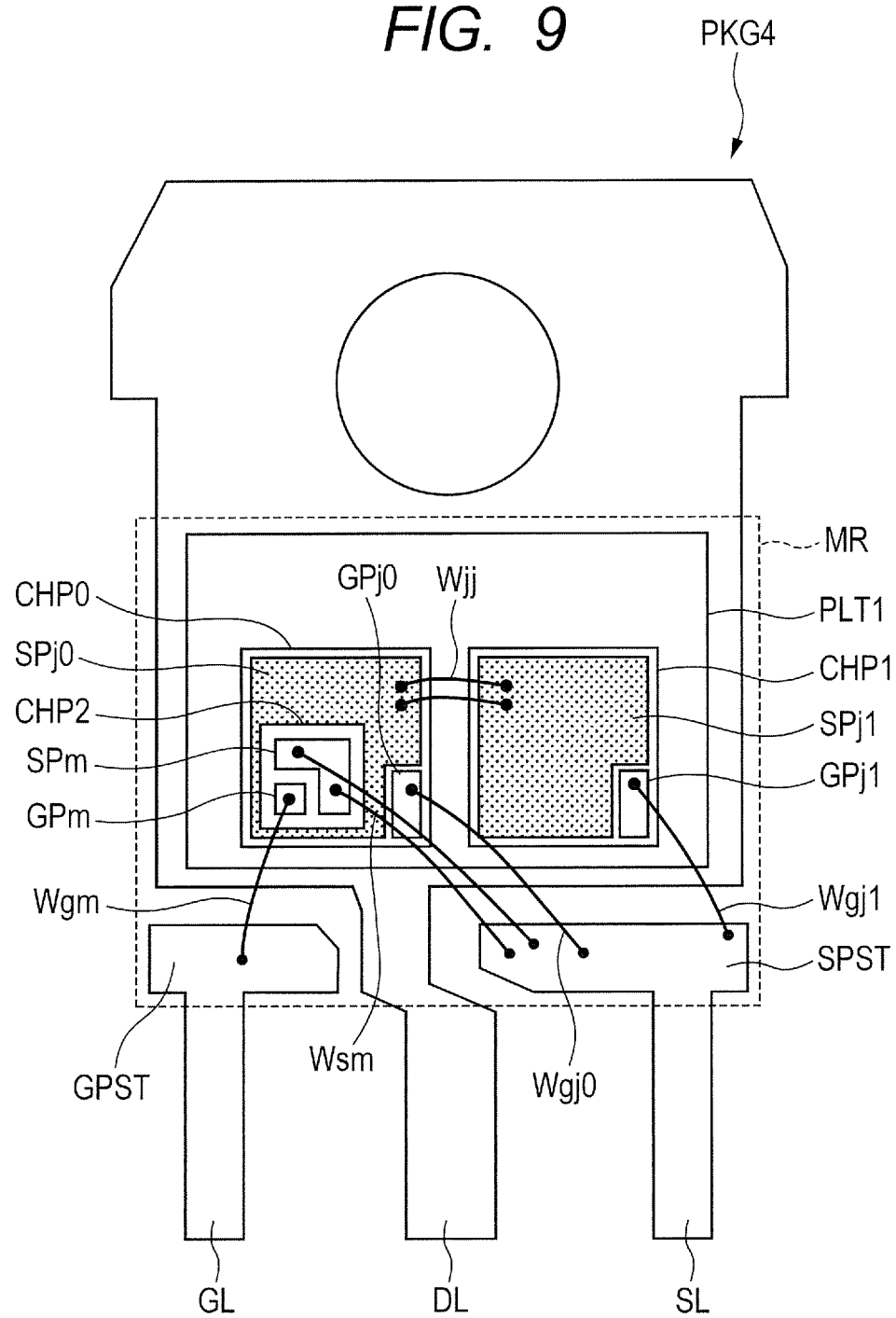
FIG. 9 is a diagram showing a mounting structure of a power semiconductor device according to a modification 3.

A description will next be made about a power semiconductor device PKG4 according to the present modification 3. FIG. 9 is a diagram showing amounting structure of the power semiconductor device PKG4 according to the present modification 3. The mounting structure of the power semiconductor device PKG4 according to the present modification 3 shown in FIG. 9 is substantially similar to that of the power semiconductor device PKG3 according to the modification 2 shown in FIG. 6.

The differences between the power semiconductor device PKG4 according to the present modification 3 shown in FIG. 9 and the power semiconductor device PKG3 according to the present modification 2 shown in FIG. 6 are as follows. That is, in the modification 2 shown in FIG. 6, the layout configuration of the surface of the semiconductor chip CHP0 and the layout configuration of the surface of the semiconductor chip CHP1 are different from each other, whereas in the present modification 3 shown in FIG. 9, the layout configuration of the surface of the semiconductor chip CHP0 and the layout configuration of the surface of the semiconductor chip CHP1 are identical to each other. Specifically, in the present modification 3, as shown in FIG. 9, the formation position of the gate pad GPj0 formed in the semiconductor chip CHP0 and the formation position of the gate pad GPj1 formed in the semiconductor chip CHP1 are identical to each other, and the formation position of the source pad SPj0 and the formation position of the source pad SPj1 are identical to each other.

Thus, according to the power semiconductor device PKG4 of the present modification 3 using the semiconductor chip CHP0 and the semiconductor chip CHP1 identical to each other in layout configuration, the manufacturing cost can be suppressed low as compared with the case where the semiconductor chip CHP0 and the semiconductor chip CHP1 different in layout configuration are used.

Modification 4

Figure 10:
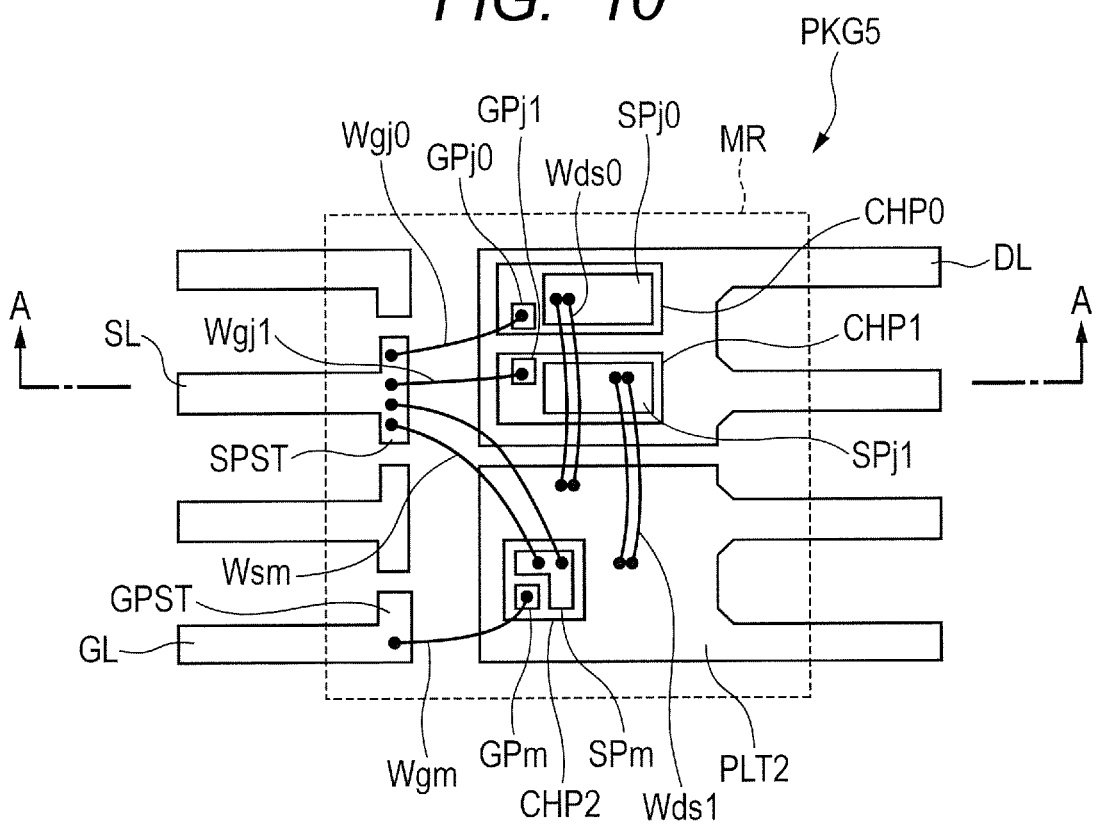
FIG. 10 is a diagram showing a mounting structure of a power semiconductor device according to a modification 4.

A description will subsequently be made about a mounting structure of a power semiconductor device PKG5 according to the present modification 4. FIG. 10 is a diagram showing the mounting structure of the power semiconductor device PKG5 according to the present modification 4. The configuration of the power semiconductor device PKG5 according to the present modification 4 shown in FIG. 10 and the configuration of the power semiconductor device PKG1 according to the embodiment 2 shown in FIG. 4 differ from each other in terms of the outer shape of each package. Specifically, the package form of the power semiconductor device PKG5 according to the present modification 4 takes a SOP (Small Outline Package). Thus, the technical idea described in the embodiment 2 can be applied not only to the power semiconductor device PKG1 shown in FIG. 4, but also to the power semiconductor device PKG5 such as shown in FIG. 10. That is, various types of general-purpose packages are known as for the package form in which the switching elements are configured to be mounted. The technical idea of the embodiment 2 can be realized by improving various general-purpose packages typified by, for example, the power semiconductor device PKG1 having the package form shown in FIG. 4 and the power semiconductor device PKG5 having the package form shown in FIG. 10. Thus, even in the power semiconductor device PKG5 shown in FIG. 10, the application of the voltage greater than the insulation breakdown voltage to the MOSFET can be suppressed, thereby making it possible to effectively suppress the avalanche breakdown of the cascode-coupled MOSFET. As a result, even in the present modification 4, the reliability of the power semiconductor device PKG5 can be improved. Further, since the technical idea in the embodiment 1 that the junction FETs are divided and formed in the separate semiconductor chips has been embodied even in the power semiconductor device PKG5 according to the present modification 4, the manufacturing yield of the power semiconductor device PKG5 can be improved.

Figure 11:
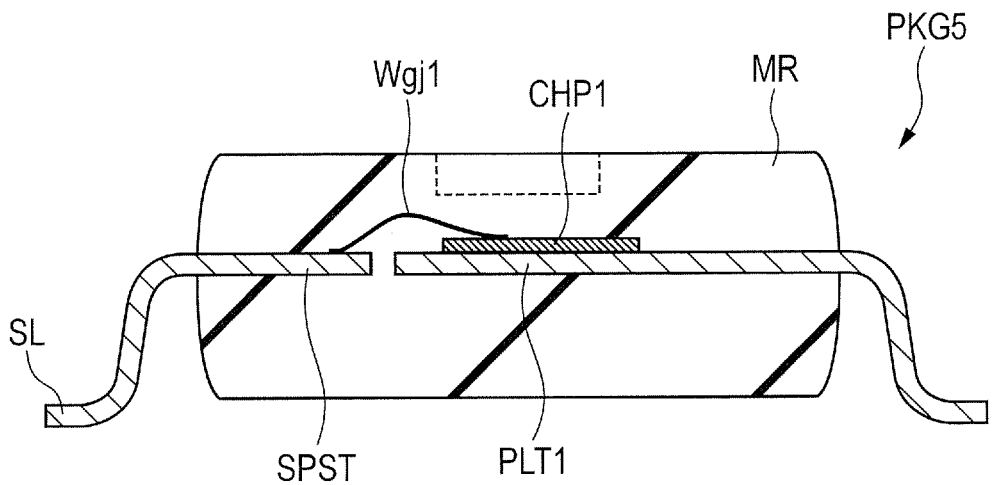
FIG. 11 is a sectional diagram cut along line A-A of FIG. 10.

Incidentally, FIG. 11 is a sectional diagram cut along line A-A of FIG. 10. As shown in FIG. 11, a semiconductor chip CHP1 is mounted over a chip mounting section PLT1 through a conductive adhesive (not shown). Then, for example, the semiconductor chip CHP1 (gate pad) and a source lead SL (source lead post section SPST) are electrically coupled by a wire Wgj1. Further, in the present modification 4, as shown in FIG. 11 for example, the chip mounting section PLT1, the semiconductor chip CHP1, the wire Wgj1, some of leads, etc. are sealed by a sealing body MR comprised of a resin. At this time, in the power semiconductor device PKG5 (SOP package) as can be analogized from FIGS. 10 and 11, the sealing body MR is formed in an approximately rectangular parallelepiped shape and has a first side surface and a second side surface opposite to the first side surface. Further, a gate lead GL and the source lead SL are configured so as to protrude from the first side surface of the sealing body MR. A drain lead DL is configured so as to protrude from the second side surface of the sealing body MR.

Modification 5

Figure 12:
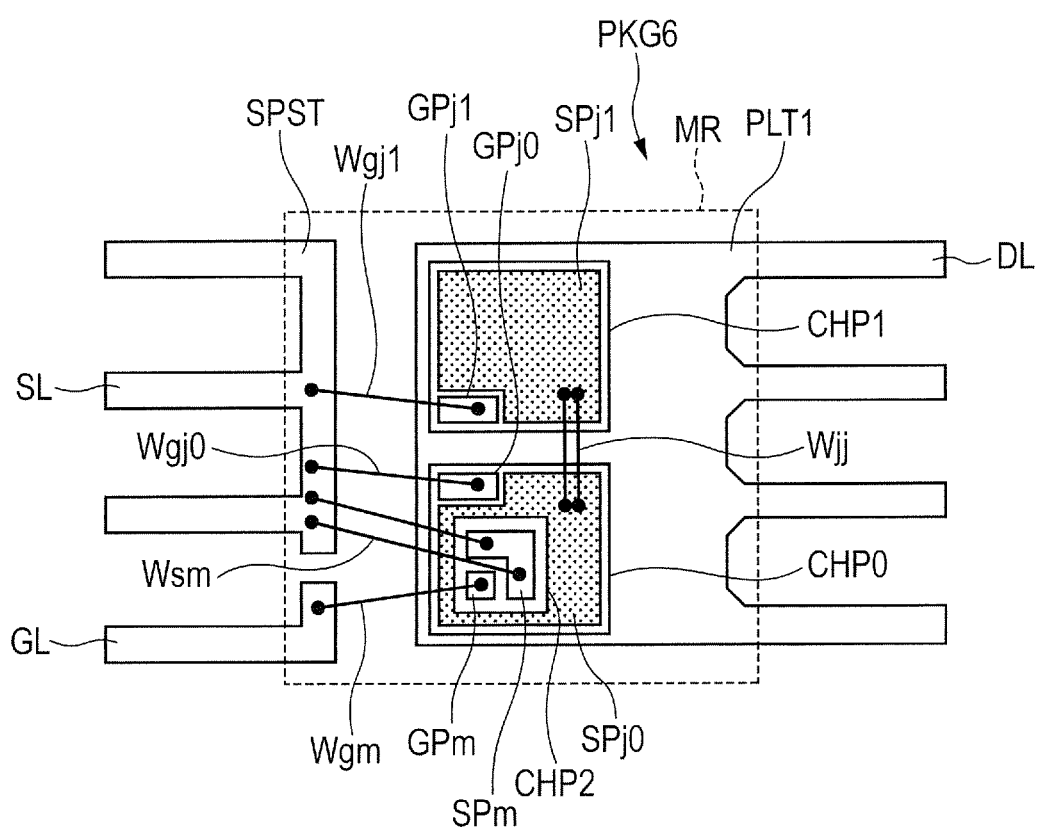
FIG. 12 is a diagram showing a mounting structure of a power semiconductor device according to a modification 5.

A description will next be made about a mounting structure of a power semiconductor device PKG6 according to the present modification 5. FIG. 12 is a diagram showing the mounting structure of the power semiconductor device PKG6 according to the present modification 5. In FIG. 12, the power semiconductor device PKG6 according to the present modification 5 is configured by combining the modification 2 and the modification 4. That is, as shown in FIG. 12, the power semiconductor device PKG6 according to the present modification 5 adopts the package form called SOP as with the modification 4. In this package form, as with the modification 2, one semiconductor chip CHP0 of two semiconductor chips (CHP0 and CHP1) formed by dividing a plurality of junction FETs, and a semiconductor chip CHP2 formed with a MOSFET are laminated over each other.

Thus, the power semiconductor device PKG6 according to the present modification 5 is capable of obtaining the advantage by the modification 2 and the advantage (advantage in the embodiment 2) by the modification 4. That is, even in the present modification 5, the reliability of the power semiconductor device PKG6 can be improved, and the manufacturing yield of the power semiconductor device PKG6 can be improved.

Embodiment 3

Although the embodiment 2 has described the points of device related to the package structure, the present embodiment 3 will describe points of device related to a device structure.

<Device Structure of MOSFET>

Figure 13:
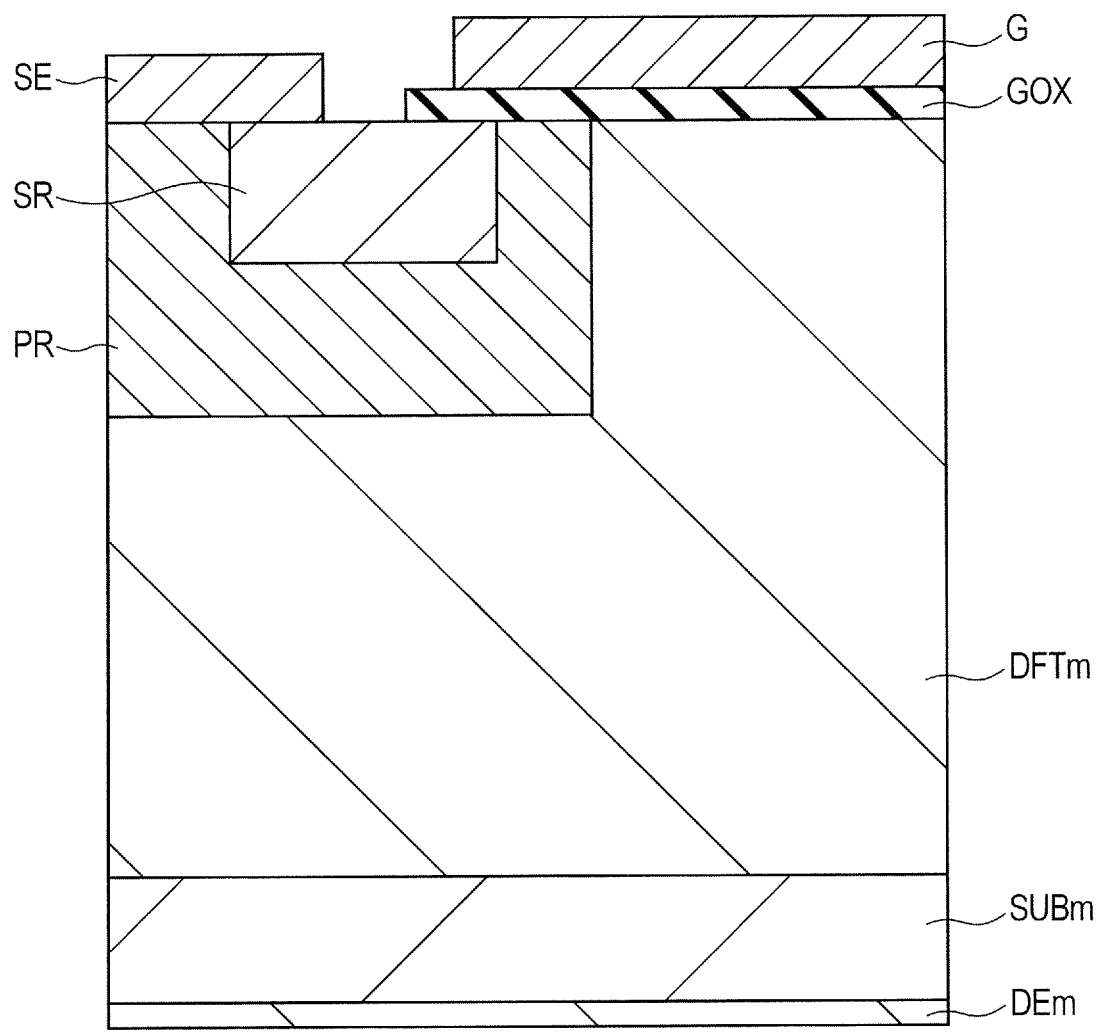
FIG. 13 is a sectional diagram showing an example of a device structure of a MOSFET according to an embodiment 3.

A description will first be made about one example of a device structure of a MOSFET formed in a semiconductor chip CHP2. FIG. 13 is a sectional diagram showing one example of the device structure of the MOSFET according to the present embodiment 3. As shown in FIG. 13, while a drain electrode DEm comprised of, for example, a gold film is formed over the back surface of a semiconductor substrate SUBm comprised of silicon doped with n-type impurities, for example, a drift layer DFTm comprised of an n-type semiconductor region is formed on the main surface side of the semiconductor substrate SUBm. A body region PR comprised of a p-type semiconductor region is formed in the drift layer DFTm, and a source region SR comprised of an n-type semiconductor region is formed so as to be included in the body region PR. A surface region of the body region PR interposed between the source region SR and the drift layer DFTm functions as a channel forming region. Then, a source electrode SE is formed so as to be electrically coupled to both the source region SR and the body region PR. Further, a gate insulating film GOX comprised of, for example, a silicon oxide film is formed in the surface of the drift layer DFTm including over the channel forming region. A gate electrode G is formed over the gate insulating film GOX.

The MOSFET configured in this way is configured in such a manner that, for example, electrons pass through the channel forming region formed in the surface of the body region PR from the source region SR and flow from the drift layer DFTm to the drain electrode DEm formed in the back surface of the semiconductor substrate SUBm. The MOSFET has a structure referred to as a so-called vertical MOSFET. The advantage of the vertical MOSFET can include the point that a MOSFET large in current density can be formed because it can be formed densely in the semiconductor chip CHP2. Accordingly, a power semiconductor device large in current density can be realized by using the vertical MOSFET in the power semiconductor device (switching element) in the embodiment 1.

When the semiconductor chip CHP2 formed with the MOSFET is laminated over the semiconductor chip CHP0 formed with the junction FETs as shown in FIG. 9, for example, the area of the semiconductor chip CHP2 formed with the MOSFET arranged over the source pad SPj0 also becomes relatively small. Even in this case, however, if the vertical MOSFET shown in FIG. 13 is used as the MOSFET formed in the semiconductor chip CHP2, a MOSFET relatively large in current density can be realized even in a small chip area. As a result, the current density of the whole power semiconductor device cascode-coupled can be made large. That is, there can be provided a high-performance power semiconductor device capable of securing a large current by using the vertical MOSFET even when the area of the semiconductor chip CHP2 formed with the MOSFET becomes small.

Device Structure of Junction FET Semiconductor Chip

Figure 14:
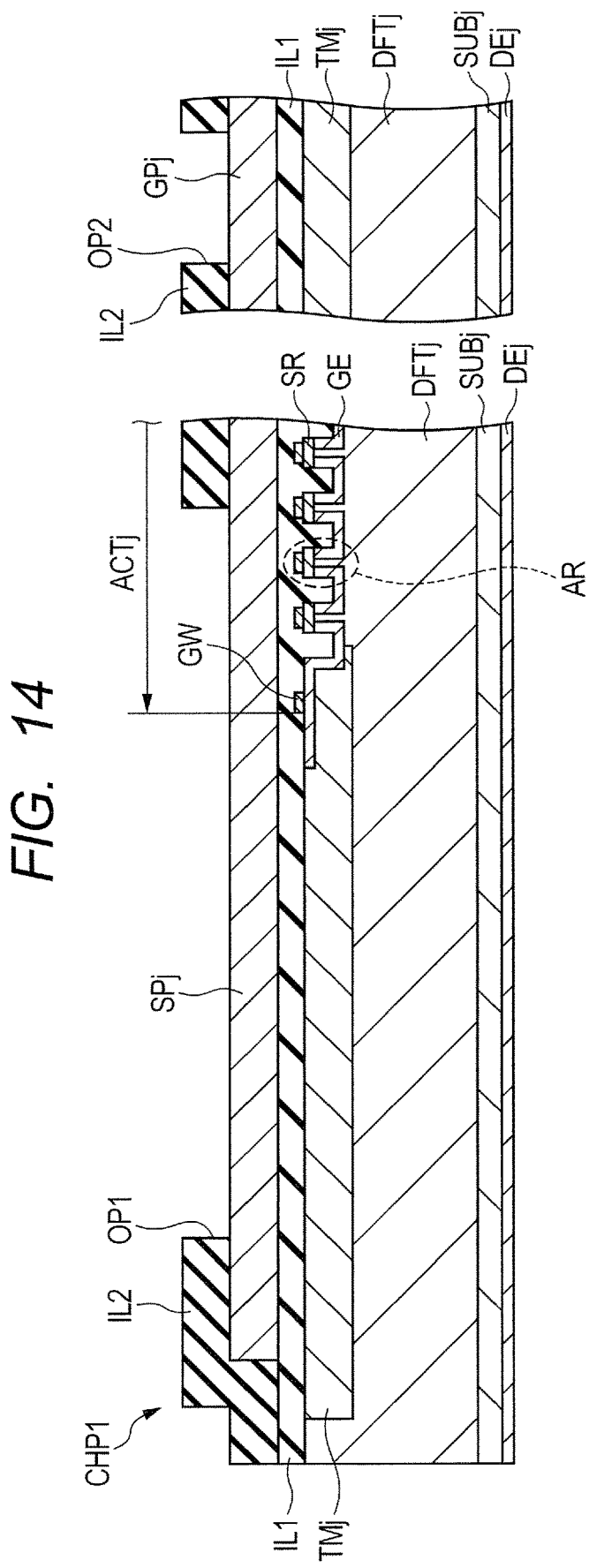
FIG. 14 is a sectional diagram typically showing a partial area of a junction FET semiconductor chip.

A description will subsequently be made about a device structure of a junction FET semiconductor chip (semiconductor chip CHP0 or semiconductor chip CHP1) formed with junction FETs. FIG. 14 is a sectional diagram typically showing a partial area of the junction FET semiconductor chip, As shown in FIG. 14, in the junction FET semiconductor chip, a drain electrode DEj is formed in the back surface of a semiconductor substrate SUBj, and a drift layer DFTj is formed in the main surface (surface) of the semiconductor substrate SUBj. An active region ACTj is formed in the drift layer DFTj, and a termination region TMj is formed in an outside region of the active region ACTj.

As shown in the left figure in FIG. 14, the active region ACTj is formed with a plurality of unit junction FETs which configure each junction FET. That is, gate electrodes GE and source regions SR of the unit junction FETs are formed in the active region ACTj. Then, the gate electrodes GE of the unit junction FETs are electrically coupled to a gate lead-out electrode GW. Further, an insulating film IL1 is formed over the active region ACTj and the termination region TMj, and a source pad SPj is formed over the insulating film IL1. Specifically, a first metal wiring layer is formed over the insulating film IL1, and an insulating film IL2 is formed over the first metal wiring layer. In addition, an opening OP1 is formed in the insulating film IL2, and an exposure region of the first metal wiring layer, which is exposed from the opening OP1, serves as the source pad SPj. The source pad SPj is electrically coupled to the source regions SR of the unit junction FETs.

On the other hand, in the right figure in FIG. 14, a second metal wiring layer formed in the same layer as the first metal wiring layer and electrically isolated therefrom is provided over the insulating film IL1. An insulating film IL2 is formed over the second metal wiring layer. Further, an opening OP2 is formed in the insulating film IL2, and an exposure region of the second metal wiring layer, which is exposed from the opening OP2, serves as a gate pad GPj. The gate pad GPj is electrically coupled to the gate lead-out electrode GW shown in the left figure in FIG. 14. Accordingly, the gate pad GPj is electrically coupled to the gate electrodes GE of the unit junction FETs through the gate lead-out electrode GW.

Incidentally, the "junction FET" formed in the junction FET semiconductor chip is comprised of a plurality of unit junction FETs coupled in parallel with each other as shown in the left figure in FIG. 14. That is, an assembly of the unit junction FETs coupled in parallel with each other configures one "junction FET", and one "junction FET" is formed in one junction FET semiconductor chip. That is, in the present specification, one "junction FET" is formed in each of the junction FET semiconductor chips. For example, one "junction FET" is formed in the semiconductor chip CHP0, and one "junction FET" is formed even in the semiconductor chip CHP1. Further, there is a case where one "junction FET" is comprised of, for example, several thousands to several tens of thousands of unit junction FETs coupled in parallel with one another. Here, it can be said that the gate electrodes GE of the unit junction FETs serve as the gate electrode of one "junction FET". It can also be said that the source regions SR of the unit junction FETs serve as the source region of one "junction FET".

From the above, each of the junction FET semiconductor chips has the semiconductor substrate SUBj formed with one "junction FET", the gate lead-out electrode GW electrically coupled to the gate electrodes GE, and the gate pad GPj electrically coupled to the gate lead-out electrode GW.

Device Structure of Unit Junction FET

Figure 15:
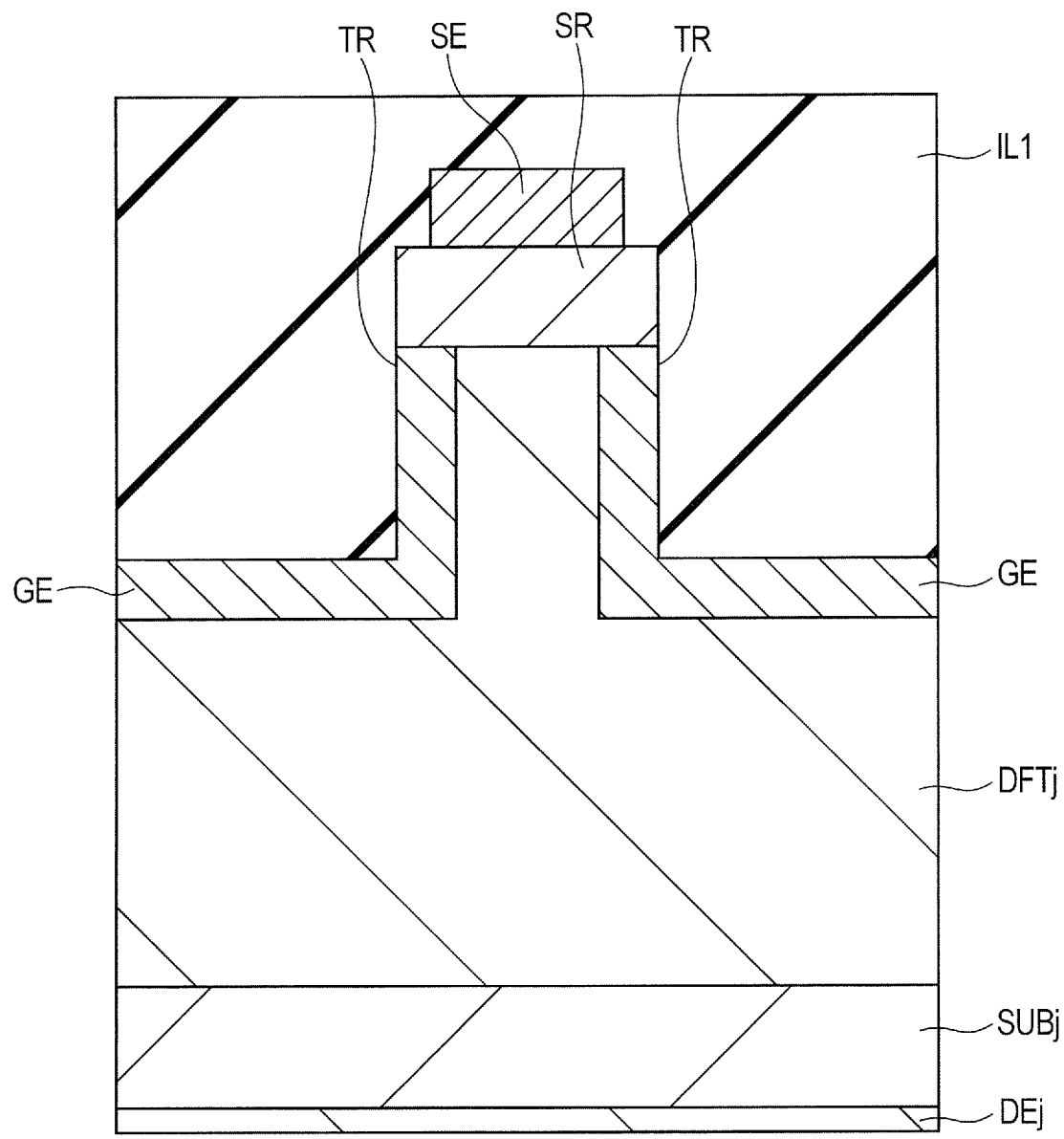
FIG. 15 is an enlarged diagram of the partial area of FIG. 14 and a sectional diagram showing a device structure of a unit junction FET.

The device structure of the unit junction FET will be described below by paying attention to an area AR in FIG. 14. FIG. 15 is an enlarged diagram of the area AR in FIG. 14 and a sectional diagram showing the device structure of the unit junction FET. As shown in FIG. 15, a drain electrode DEj is formed in the back surface of a semiconductor substrate SUBj. On the other hand, a drift layer DFTj is formed on the main surface side opposite to the back surface of the semiconductor substrate SUBj, and a plurality of trenches TR are formed in the drift layer DFTj. Further, gate electrodes GE (also called gate regions) are formed at the side and bottom surfaces of the trenches TR. A channel forming region is formed so as to be interposed between the gate electrodes GE formed at the side and bottom surfaces of the adjacent trenches TR. A source region SR is formed above the channel forming region, and a source electrode SE is formed over the source region SR. Further, an insulating film IL1 is formed so as to embed each trench TR.

In the unit junction FET configured in this way, the extension of a depletion layer from each of the gate electrodes GE is controlled by controlling the voltage applied to the gate electrode GE. Thus, when the depletion layers extending from the gate electrodes GE adjacent to each other are linked together, the channel forming region disappears so that an off state is realized. On the other hand, when the depletion layers extending from the gate electrodes GE adjacent to each other are not linked, the channel forming region is formed so that the on state is realized.

Feature of Embodiment 3

A description will next be made about a feature point in the present embodiment 3. The feature point in the present embodiment 3 resides in that the gate pad GPj is formed in an upper layer of the gate lead-out electrode GW as shown in FIG. 14. That is, in the present embodiment 3, the gate pad GPj and the gate lead-out electrode GW are formed in a two-layer structure. Thus, according to the present embodiment 3, the gate resistance of the junction FET can be reduced. Specifically, according to the present embodiment 3, the gate wiring resistance rgj0 and the gate wiring resistance rgj1 shown in FIG. 1 can be reduced in value.

This is because it means that when the gate pad GPj and the gate lead-out electrode GW are formed in the two-layer structure as shown in FIG. 14, the thickness of the gate pad GPj can be made thicker than the thickness of the gate lead-out electrode GW, so that the gate wiring resistance becomes small with its thickening.

For example, it is considered from the viewpoint of a cost reduction that the gate pad GPj and the gate lead-out electrode GW are formed in the same layer. That is, it is considered that the gate pad GPj and the gate lead-out electrode GW are formed as one layer structure. In this case, however, the thickness of the gate pad GPj becomes the same degree as the thickness of the gate lead-out electrode GW. On the other hand, when the gate pad GPj and the gate lead-out electrode GW are formed in the two-layer structure as in the present embodiment 3, the thickness of the gate pad GPj can be made thicker than the thickness of the gate lead-out electrode GW. Further, in the present embodiment 3, the gate pad GPj and the gate lead-out electrode GW are formed of a material comprised principally of aluminum low in resistivity. From this point also, the resistances of the gate pad GPj and the gate lead-out electrode GW can be reduced.

Here, the "principal component" described in the present specification refers to a material component most contained in component materials that configure members (layers and films). For example, the "member comprised principally of aluminum" means that the member most contains aluminum (Al). The intention to use the term of "principal component" in the present specification is used to express that, for example, the member is basically comprised of aluminum, but in addition, containing impurities therein is not excluded.

For example, the conductor film (metal film) comprised principally of aluminum described in the present specification is used in a broad concept including not only where it is a pure aluminum film, but also an aluminum alloy film (AlSi film) containing aluminum added with silicon, and an aluminum alloy film (AlSiCu film) containing aluminum added with silicon and copper. Accordingly, the gate pad GPj containing these aluminum alloy films is also included in the "gate pad GPj comprised principally of aluminum".

As described above, the feature point in the present embodiment 3 includes (1) the point that the gate pad GPj and the gate lead-out electrode GW are formed in the two-layer structure, (2) the point that the thickness of the gate pad GPj is thicker than that of the gate lead-out electrode GW, and (3) the point that the gate pad GPj and the gate lead-out electrode GW are respectively formed of the material comprised principally of aluminum low in resistivity. Therefore, according to the present embodiment 3, the gate wiring resistances (gate wiring resistance rgj0 and gate wiring resistance rgj1 shown in FIG. 1) of the junction FETs can be reduced by the synergistic effect of the feature points described in the above (1) through (3).

As a result, according to the power semiconductor device according to the present embodiment 3, since the gate impedances of the junction FETs can be reduced, the application of the voltage greater than the insulation breakdown voltage to the MOSFET due to the increase in the gate impedance of each of the junction FETs can be suppressed, thereby making it possible to effectively suppress the avalanche breakdown of the cascode-coupled MOSFET. That is, according to the present embodiment 3, the reliability of the power semiconductor device can be improved.

In particular, by combining the device-structural contrivance described in the present embodiment 3 and the package-structural contrivance described in the embodiment 2, the gate wiring resistance rgj0 and the gate wiring resistance rgj1 shown in FIG. 1 can be reduced, and the parasitic resistance Rgj0 and the parasitic resistance Rgj1 shown in FIG. 1 can be reduced. In this case, since the gate impedances of the junction FETs can be further reduced, a further improvement in the reliability of the power semiconductor device can be achieved, and advantageous effects shown below can also be obtained.

That is, the reduction in the parasitic resistance of each junction FET means that the resistive component difficult to adjust becomes small. Thus, the adjustment range of the gate resistance of each junction FET becomes large. As a result, for example, it becomes easy to adjust a gage resistance value by an external resistor. The degree of freedom in adjustment of the switching speed of the power semiconductor device can be improved. That is, as a result of facilitating the setting of the external resistor to the optimum value, the switching speed of the power semiconductor device can be controlled while preventing the cascode-coupled MOSFET from insulation breakdown. There can be obtained an advantageous effect that switching noise in a system apparatus.

Embodiment 4

The present embodiment 4 will describe an example in which the power semiconductor device described in each of the embodiments 1 through 3 is applied to a control system for controlling a motor mounted to, for example, a hybrid vehicle or an electric vehicle.

Figure 16:
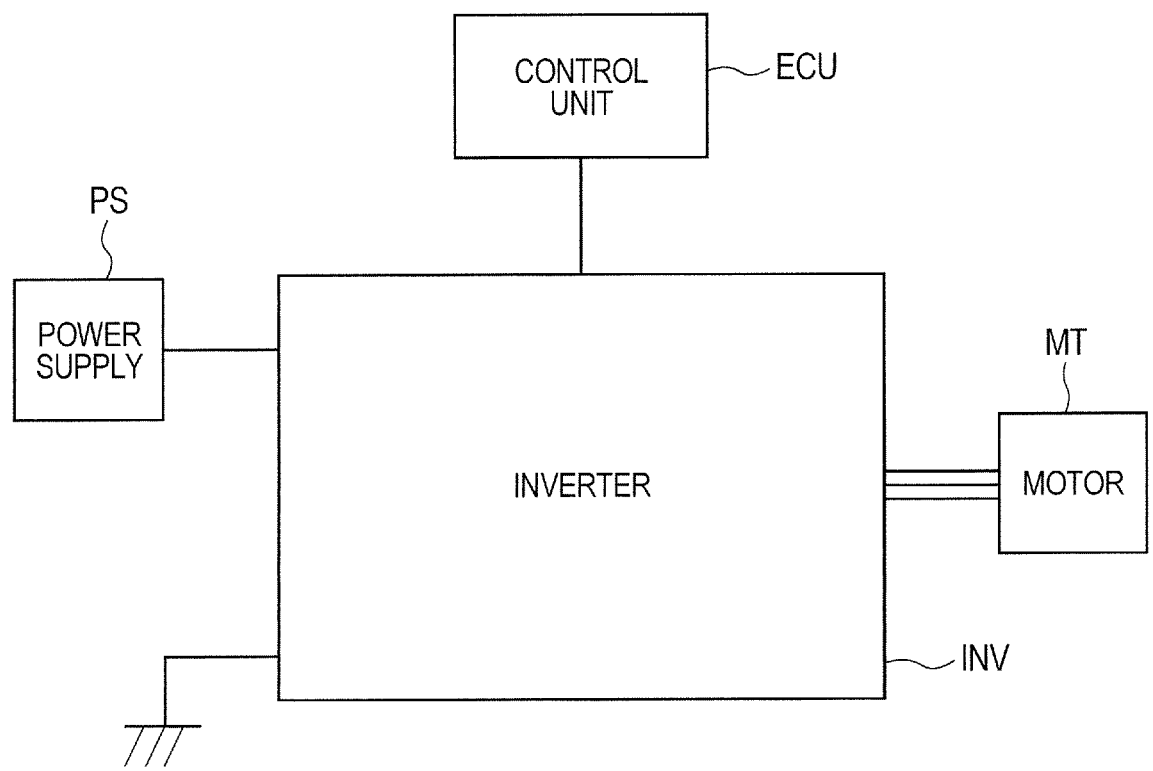
FIG. 16 is a block diagram showing the configuration of a control system according to an embodiment 4.

FIG. 16 is a block diagram showing the configuration of the control system according to the present embodiment 4. In FIG. 16, the control system according to the present embodiment 4 has a power supply PS, a control unit ECU, an inverter INV and a motor MT. In the control system according to the present embodiment 4, the inverter INV which receives the supply of power from the power supply PS is controlled by control by the control unit ECU and configured to drive the motor MT corresponding to a load. For example, the control unit ECU and the inverter INV configure an electronic apparatus.

That is, the electronic apparatus in the present embodiment 4 is equipped with the inverter INV which is electrically coupled to the motor MT corresponding to the load and drives the motor MT, and the control unit which controls the inverter INV. At this time, the inverter INV includes as a component, the power semiconductor device described in each of the embodiments 1 through 3.

Figure 17:
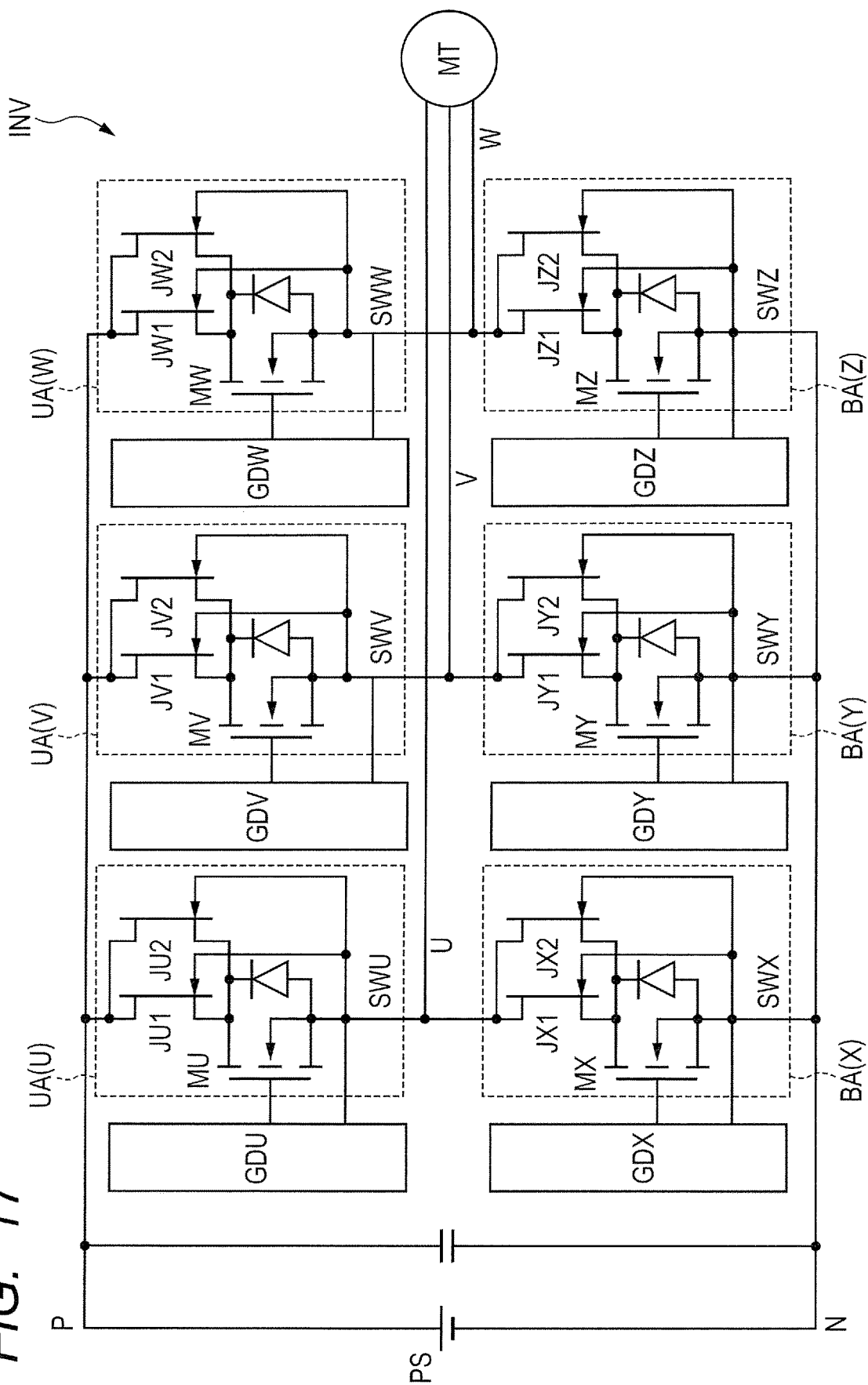
FIG. 17 is a circuit block diagram of an inverter which drives a motor in accordance with an input signal from a control unit.

A description will be made below about a circuit configuration example of the inverter INV including as the component, the power semiconductor device described in each of the embodiments 1 through 3. FIG. 17 is a circuit block diagram of the inverter INV which drives the motor MT as a three-phase motor, for example, in accordance with an input signal from the control unit (control unit ECU in FIG. 16).

In FIG. 17, the inverter INV has six cascode switches SWU, SWV, SWW, SWX, SWY, and SWZ. Each of these six cascode switches SWU, SWV, SWW, SWX, SWY, and SWZ is comprised of the power semiconductor device described in each of the embodiments 1 through 3.

The cascode switch SWU configures an upper arm UA (U) which controls a U phase of the motor MT. The cascode switch SWX configures a lower arm BA (X) which controls the U phase of the motor MT. Further, the cascode switch SWU is comprised of a cascode coupling of a plurality of junction FETs (JU1, JU2) and a MOSFET (MU). The cascode switch SWX is comprised of a cascode coupling of a plurality of junction FETs (JX1, JX2) and a MOSFET (MX).

Likewise, the cascode switch SWV configures an upper arm UA (V) which controls a V phase of the motor MT. The cascode switch SWY configures a lower arm BA (Y) which controls the V phase of the motor MT. Further, the cascode switch SWV is comprised of a cascode coupling of a plurality of junction FETs (JV1, JV2) and a MOSFET (MV). The cascode switch SWX is comprised of a cascode coupling of a plurality of junction FETs (JY1, JY2) and a MOSFET (MY).

Similarly, the cascode switch SWW configures an upper arm UA (W) which controls a W phase of the motor MT. The cascode switch SWZ configures a lower arm BA (Z) which controls the W phase of the motor MT. Further, the cascode switch SWW is comprised of a cascode coupling of a plurality of junction FETs (JW1, JW2) and a MOSFET (MW). The cascode switch SWZ is comprised of a cascode coupling of a plurality of junction FETs (JZ1, JZ2) and a MOSFET (MZ).

Further, in FIG. 17, the six cascode switches SWU, SWV, SWW, SWX, SWY, and SWZ are respectively controlled by six drive circuits GDU, GDV, GDW, GDX, GDY, and GDZ which configure part of the control unit ECU shown in FIG. 16. That is, the six drive circuits GDU, GDV, GDW, GDX, GDY, and GDZ are provided corresponding to the six cascode switches SWU, SWV, SWW, SWX, SWY, and SWZ.

Specifically, the drive circuit GDU electrically couples a gate electrode of the MOSFET (MU) configuring the cascode switch SWU and gate electrodes of the junction FETs (JU1, JU2). Also, the drive circuit GDV electrically couples a gate electrode of the MOSFET (MV) configuring the cascode switch SWV and gate electrodes of the junction FETs (JV1, JV2). Further, the drive circuit GDW electrically couples a gate electrode of the MOSFET (MW) configuring the cascode switch SWW and gate electrodes of the junction FETs (JW1, JW2).

Likewise, the drive circuit GDX electrically couples a gate electrode of the MOSFET (MX) configuring the cascode switch SWX and gate electrodes of the junction FETs (JX1, JX2). Also, the drive circuit GDY electrically couples a gate electrode of the MOSFET (MY) configuring the cascode switch SWY and gate electrodes of the junction FETs (JY1, JY2). Further, the drive circuit GDZ electrically couples a gate electrode of the MOSFET (MZ) configuring the cascode switch SWZ and gate electrodes of the junction FETs (JZ1, JZ2).

Here, in the present embodiment 4, not only the gate electrode of the MOSFET, but also the gate electrodes of the junction FETs are controlled by the drive circuit (gate drive circuit). In this case, since the source voltage of each junction FET can be controlled to a desired level by controlling the gate electrode of the junction FET by the drive circuit, it is possible to obtain an effect that a surge voltage at an intermediate node can be suppressed. Although the number of terminals increases in the case of this configuration, there can be obtained an advantage that a lower-loss switching element can be provided. Incidentally, the drive circuit may of course be configured to drive only the gate electrode of the MOSFET. In this case, it is possible to obtain an advantage that a change in the drive circuit (gate drive circuit) where a single MOSFET is used as the power semiconductor device becomes unnecessary.

In the inverter INV configured in this way, the two cascode switches (upper and lower arms) operated as corresponding to one phase of each switch circuit are coupled in series across a power supply voltage (e.g., 300V) supplied from the power supply PS. The two cascode switches coupled in series perform switching operations complementarily to each other in accordance with input signals from the drive circuits. With the complementary switching operations, an output signal is outputted from a coupling point (U, V, W) of the two cascode switches to the motor MT as the load.

In FIG. 17, the cascode switch SWU and the cascode switch SWX are coupled in series, and a signal for driving the U phase of the motor MT as the load is outputted from the coupling point (U) thereof. Likewise, the cascode switch SWV and the cascode switch SWY are coupled in series, and a signal for driving the V phase of the motor MT is outputted from the coupling point (V) thereof. As with the above, the cascode switch SWW and the cascode switch SWZ are coupled in series, and a signal for driving the W phase of the motor MT is outputted from the coupling point (W) thereof.

Incidentally, in FIG. 17, a free wheel diode is a built-in diode of each MOSFET (MU, MV, MW, MX, MY, MZ). Further, in FIG. 17, the positive potential side of the power supply PS is indicated by "P", and the negative potential side of the power supply PS is indicated by "N".

Since each of the cascode switches SWU, SWV, SWW, SWX, SWY, and SWZ described in the present embodiment 4 is comprised of the power semiconductor device described in each of the embodiments 1 through 3, it is low in on resistance and capable of preventing the breakdown of the MOSFET. Therefore, even when a motor drive current is large, a reduction in power loss of the control system (inverter system) and its high reliability can be made compatible.

Although the invention made above by the present inventors has been described specifically on the basis of the preferred embodiments, the present invention is not limited to the embodiments referred to above. It is needless to say that various changes can be made thereto within the scope not departing from the gist thereof.

Although, for example, the above embodiment has described the example in which each of the junction FET semiconductor chips uses silicon carbide as the material, the technical idea in the embodiment can be applied even to the example in which the junction FET semiconductor chips respectively use gallium nitride as the material.

Also, in the present embodiment, there is shown the example in which the two junction FETs are coupled in parallel, as the configuration example in which the junction FETs are coupled in parallel. The number of junction FETs is not however limited to the two, but may be three or more, for example.

Besides, as to the package forms described in the embodiment 2, the arrangement of the leads is not limited to these either. That is, the arrangement positions of the gate, drain and source leads can be changed in various ways. For example, when a package is mounted onto a mounting substrate, the lead arrangement of the package can be determined in such a manner that the existing lead arrangement can be diverted. In this case, a change in the mounting substrate becomes unnecessary, and an increase in the cost accompanying a design change can also be suppressed.

Further, the layout configuration of the laminated semiconductor chips is particularly not limited only to the layout configuration described in the specification either. The shape of each semiconductor chip, the shape of each pad, the shape of the termination region, etc. are not particularly limited either. Besides, the structures of the junction FET and the MOSFET are not limited, and the various existing structures can be applied. Further, the profile of impurities in the device can be changed freely. For example, in the MOSFET, impurities may be injected such that the concentration thereof in its surface is made low to avoid punch-through, and the concentration thereof is made high gradually in a depth direction.

Incidentally, the above-described MOSFET is not limited to the case where the gate insulating film is formed of the oxide film, but is assumed as including even a MISFET (Metal Insulator Semiconductor Field Effect Transistor) in which a gate insulating film is formed widely of an insulating film. That is, the term MOSFET is used for convenience in the present specification, but this MOSFET is used in the present specification as a term intended to include even the MISFET.

The power semiconductor device described in the embodiment can be applied to an inverter for a hybrid vehicle or an electric vehicle, but is not limited to it. The power semiconductor device is applicable to various devices such as an inverter for an air conditioner, a power conditioner for a solar power generation system, a switching power supply circuit, a power supply module for a PC, a white LED inverter, etc.

What is claimed is:

1. A semiconductor device, comprising:
a first semiconductor chip including a first substrate comprised of a semiconductor larger in bandgap than silicon,
the first semiconductor chip being formed with a first FET (Field-Effect Transistor) including a first gate electrode, a first source, and a first drain;
a second semiconductor chip including a second substrate comprised of a semiconductor larger in bandgap than silicon,
the second semiconductor chip being formed with a second FET having a second gate electrode, a second source, and a second drain; and
a third semiconductor chip including a third substrate comprised of silicon, the third semiconductor chip being formed
with a MOSFET (Metal-Oxide-Semiconductor Field-Effect Transistor) including a third gate electrode, a third source, and a third drain; wherein
the first semiconductor chip and the second semiconductor chip are mounted over a first chip mounting section,
the third semiconductor chip is mounted over a second chip mounting section which is different from the first chip mounting section,
the first source of the first FET and the third drain of the MOSFET being electrically coupled,
the second source of the second FET and the third drain of the MOSFET being electrically coupled,
the first gate electrode of the first FET and the third source of the MOSFET being electrically coupled, and
the second gate electrode of the second FET and the third source of the MOSFET being electrically coupled.

2. The semiconductor device according to claim 1, wherein
the first FET and the second FET are respectively a normally-on type, and wherein the MOSFET is a normally-off type.

3. The semiconductor device according to claim 1, wherein
the first semiconductor chip and the second semiconductor chip are of the same size with each other.

4. The semiconductor device according to claim 1, wherein
first lower surface of the first chip mounting section is exposed from a sealing body.

5. The semiconductor device according to claim 1, wherein
a layout configuration of upper surface of the first semiconductor chip, and a layout configuration of upper surface of the second semiconductor chip are the same as each other.

6. The semiconductor device according to claim 1, further comprising
a drain lead coupled to the first chip mounting section;
a source lead separated from the drain lead;
a gate lead separated from the drain lead and the source lead;
a first metal conductor which electrically couples a gate of the first semiconductor chip and the source lead; and
a second metal conductor which electrically couples a gate of the second semiconductor chip and the source lead,
wherein length of the first metal conductor and length of the second metal conductor are the same as each other.

7. The semiconductor device according to claim 6, further comprising:
a third metal conductor which electrically couples source of the first semiconductor chip and upper surface of the second chip mounting section; and
a fourth metal conductor which electrically couples source of the second semiconductor chip and the upper surface of the second chip mounting section,
wherein length of the third metal conductor and length of the fourth metal conductor are the same as each other.

8. A semiconductor device, comprising:
a first semiconductor chip including a first substrate comprised of a semiconductor greater in bandgap than silicon,
the first semiconductor chip being formed with a first transistor including a first control electrode, a first source, and a first drain;
a second semiconductor chip including a second substrate comprised of a semiconductor larger in bandgap than silicon, the second semiconductor chip being formed with a second transistor including a second control electrode, a second source, and a second drain; and
a third semiconductor chip including a third substrate comprised of silicon, the third semiconductor chip being formed with a FET (Field-Effect Transistor) including a third control electrode, a third source, and a third drain; wherein
the first semiconductor chip and the second semiconductor chip are mounted over a first chip mounting section,
the third semiconductor chip is mounted over a second chip mounting section which is different from the first chip mounting section,
the first source of the first transistor and the third drain of the FET being electrically coupled,
the second source of the second FET and the third drain of the FET being electrically coupled,
the first control electrode of the first transistor and the third source of the FET being electrically coupled, and
the second control electrode of the second transistor and the third source of the FET being electrically coupled.

9. The semiconductor device according to claim 8, wherein
the first transistor and the second transistor are respectively a normally-on type, and wherein the FET is a normally-off type.

10. The semiconductor device according to claim 8, wherein
the first semiconductor chip and the second semiconductor chip are of the same size with each other.

11. The semiconductor device according to claim 8, wherein
first lower surface of the first chip mounting section is exposed from a sealing body.

12. The semiconductor device according to claim 8, wherein
a layout configuration of upper surface of the first semiconductor chip, and a layout configuration of upper surface of the second semiconductor chip are the same as each other.

13. The semiconductor device according to claim 8, further comprising:
a drain lead coupled to the first chip mounting section;
a source lead separated from the drain lead;
a control electrode lead separated from the drain lead and the source lead;

a first metal conductor which electrically couples a control electrode of the first semiconductor chip and the source lead; and a second metal conductor which electrically couples a control electrode of the second semiconductor chip and the source lead, wherein a length of the first metal conductor and a length of the second metal conductor are the same as each other.

14. The semiconductor device according to claim 13, further comprising:

a third metal conductor which electrically couples source of the first semiconductor chip and upper surface of the second chip mounting section; and a fourth metal conductor which electrically couples source of the second semiconductor chip and the upper surface of the second chip mounting section, wherein length of the third metal conductor and length of the fourth metal conductor are the same as each other.

15. A semiconductor device, comprising:

a first semiconductor chip including a first substrate comprised of a semiconductor greater in bandgap than silicon, the first semiconductor chip being formed with a first FET (Fielf-Effect Transistor) including a first gate electrode, a first source, and a first drain;

a second semiconductor chip including a second substrate comprised of a semiconductor greater in bandgap than silicon, the second semiconductor chip being formed with a second FET including a second gate electrode, a second source, and a second drain; and a third semiconductor chip including a third substrate comprised of silicon, the third semiconductor chip being formed with a third FET including a third gate electrode, a third source, and a third drain; wherein the first semiconductor chip and the second semiconductor chip are mounted over a first chip mounting section, the third semiconductor chip is mounted over a second chip mounting section which is different from the first chip mounting section, the first gate electrode of the first FET and the third source of the third FET being electrically coupled, and the second gate electrode of the second FET and the third source of the third FET being electrically coupled.

16. The semiconductor device according to claim 15, wherein the first FET and the second FET are both a normally-on type, and wherein the third FET is a normally-off type.

17. The semiconductor device according to claim 15, wherein the first semiconductor chip and the second semiconductor chip are substantially a same size with each other.

18. The semiconductor device according to claim 15, wherein first lower surface of the first chip mounting section is exposed from a sealing body.

19. The semiconductor device according to claim 15, wherein a layout configuration of upper surface of the first semiconductor chip, and a layout configuration of upper surface of the second semiconductor chip are the same as each other.

20. The semiconductor device according to claim 15, further comprising:

a drain lead coupled to the first chip mounting section;

a source lead separated from the drain lead;

a gate lead separated from the drain lead and the source lead;

a first metal conductor which electrically couples a gate of the first semiconductor chip and the source lead;

a second metal conductor which electrically couples a gate of the second semiconductor chip and the source lead, wherein length of the first metal conductor and length of the second metal conductor are the same as each other;

a third metal conductor which electrically couples source of the first semiconductor chip and upper surface of the second chip mounting section; and a fourth metal conductor which electrically couples source of the second semiconductor chip and the upper surface of the second chip mounting section, wherein length of the third metal conductor and length of the fourth metal conductor are the same as each other.

* * * * *